(12) United States Patent
Chen

(10) Patent No.: US 10,038,123 B2
(45) Date of Patent: Jul. 31, 2018

(54) PHOSPHOR-COATED LIGHT EXTRACTION STRUCTURES FOR PHOSPHOR-CONVERTED LIGHT EMITTING DEVICES

(71) Applicant: Maven Optronics Corp., Palo Alto, CA (US)

(72) Inventor: Chieh Chen, Palo Alto, CA (US)

(73) Assignee: MAVEN OPTRONICS INTERNATIONAL, LTD., Causeway Bay (HK)

( * ) Notice: Subject to any disclaimer, the term of this patent is extended or adjusted under 35 U.S.C. 154(b) by 300 days.

(21) Appl. No.: 14/934,938

(22) Filed: Nov. 6, 2015

(65) Prior Publication Data

US 2016/0064626 A1    Mar. 3, 2016

Related U.S. Application Data

(60) Continuation of application No. 13/970,408, filed on Aug. 19, 2013, now Pat. No. 9,210,763, which is a division of application No. 12/617,680, filed on Nov. 12, 2009.

(60) Provisional application No. 61/114,215, filed on Nov. 13, 2008.

(51) Int. Cl.
  *H05B 33/10* (2006.01)
  *H01L 33/50* (2010.01)
  *H01L 33/58* (2010.01)
  *H05B 33/14* (2006.01)

(52) U.S. Cl.
  CPC .......... *H01L 33/504* (2013.01); *H01L 33/501* (2013.01); *H01L 33/507* (2013.01); *H01L 33/58* (2013.01); *H05B 33/10* (2013.01); *H05B 33/145* (2013.01); *H01L 2924/0002* (2013.01); *H01L 2933/0025* (2013.01);
  (Continued)

(58) Field of Classification Search
  None
  See application file for complete search history.

(56) References Cited

U.S. PATENT DOCUMENTS

| | | |
|---|---|---|
| 5,466,947 A | 11/1995 | Fleig et al. |
| 5,959,316 A | 9/1999 | Lowery |
| 6,531,328 B1 | 3/2003 | Chen |

(Continued)

FOREIGN PATENT DOCUMENTS

| | | |
|---|---|---|
| EP | 0 455 401 A2 | 11/1991 |
| EP | 1 418 628 | 5/2004 |

(Continued)

OTHER PUBLICATIONS

English translation of Notice of Reasons for Rejection for Japanese Patent Application No. 2015-93844, dated Mar. 23, 2016, 7 pages.

(Continued)

*Primary Examiner* — Andrew Coughlin
(74) *Attorney, Agent, or Firm* — Foley & Lardner LLP; Cliff Z. Liu

(57) ABSTRACT

A conformal thin-film phosphor layer is disposed over a surface of a hemispherical lens, a Fresnel lens, or a microlens array, thereby forming a phosphor-coated light extraction structure. Also disclosed is a phosphor-converted photonic crystal light emitting device that incorporates a thin-film phosphor layer. A wafer-level packaging process incorporating a thin-film phosphor layer is also disclosed herein.

22 Claims, 13 Drawing Sheets

(52) U.S. Cl.
CPC .......... *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| 6,576,488 | B2 | 6/2003 | Collins et al. |
| 7,259,400 | B1 | 8/2007 | Taskar |
| 2003/0038249 | A1 | 2/2003 | Hackenschmied et al. |
| 2004/0018379 | A1 | 1/2004 | Kinlen |
| 2004/0090161 | A1 | 5/2004 | Noguchi et al. |
| 2004/0263073 | A1 | 12/2004 | Baroky et al. |
| 2005/0040340 | A1 | 2/2005 | Morikawa et al. |
| 2005/0067584 | A1 | 3/2005 | Bergh et al. |
| 2006/0027828 | A1 | 2/2006 | Kikuchi |
| 2006/0096721 | A1 | 5/2006 | Jones |
| 2006/0097621 | A1 | 5/2006 | Park et al. |
| 2006/0097633 | A1 | 5/2006 | Cho et al. |
| 2006/0105485 | A1 | 5/2006 | Basin et al. |
| 2006/0124953 | A1 | 6/2006 | Negley et al. |
| 2007/0001182 | A1 | 1/2007 | Schardt et al. |
| 2007/0004065 | A1 | 1/2007 | Schardt et al. |
| 2007/0228933 | A1 | 10/2007 | Maruyama et al. |
| 2007/0228949 | A1 | 10/2007 | Maruyama et al. |
| 2008/0038249 | A1 | 2/2008 | Hopf et al. |
| 2008/0048200 | A1 | 2/2008 | Mueller et al. |
| 2008/0150416 | A1 | 6/2008 | Maruyama et al. |
| 2008/0231172 | A1 | 9/2008 | Chou et al. |
| 2009/0095265 | A1 | 4/2009 | Yoshida |
| 2009/0295265 | A1 | 12/2009 | Tabuchi et al. |
| 2009/0321755 | A1 | 12/2009 | Jang et al. |

FOREIGN PATENT DOCUMENTS

| | | | |
|---|---|---|---|
| EP | 1 657 758 | A2 | 5/2006 |
| EP | 1 840 977 | A1 | 10/2007 |
| EP | 1 785 464 | A1 | 10/2009 |
| JP | 04-230996 | | 8/1992 |
| JP | 04-504441 | | 8/1992 |
| JP | H08-054500 | | 2/1996 |
| JP | 2002-050799 | A | 2/2002 |
| JP | 2002-252372 | A | 9/2002 |
| JP | 2002-352609 | | 12/2002 |
| JP | 2003-110146 | A | 4/2003 |
| JP | 2004-119743 | A | 4/2004 |
| JP | 2004-239713 | | 8/2004 |
| JP | 2005-019997 | | 1/2005 |
| JP | 2005-125764 | | 5/2005 |
| JP | 2006-128710 | A | 5/2006 |
| JP | 2007-194675 | | 8/2007 |
| JP | 2007-262375 | A | 10/2007 |
| JP | 2007-535175 | | 11/2007 |
| JP | 2008-135539 | | 6/2008 |
| JP | 2008-159986 | A | 7/2008 |
| JP | 2008-250106 | | 10/2008 |
| JP | 2008-251940 | | 10/2008 |
| KR | 1020050113200 | | 1/2005 |
| KR | 10-2005-0113200 | | 12/2005 |
| KR | 10-2006-0040321 | A | 5/2006 |
| KR | 10-2006-0128373 | A | 12/2006 |
| KR | 10-2008-0087218 | | 10/2008 |
| TW | 552726 | | 9/2003 |
| TW | 200412196 | | 7/2004 |
| TW | 200623459 | | 7/2006 |
| TW | 200625682 | | 7/2006 |
| TW | 200814377 | | 3/2008 |
| TW | M330570 | | 4/2008 |
| TW | M338439 | | 8/2008 |
| TW | 200836372 | | 9/2008 |
| WO | WO-91/10715 | | 7/1991 |
| WO | WO-00/33390 | | 6/2000 |
| WO | WO-2004/077580 | | 9/2004 |
| WO | WO-2005/106926 | | 11/2005 |
| WO | WO-2008/013780 | | 1/2008 |
| WO | WO-2008/019041 | A2 | 2/2008 |
| WO | WO-2008/100991 | A1 | 8/2008 |
| WO | WO-2008/104936 | A2 | 9/2008 |

OTHER PUBLICATIONS

Hidetoshi Kenbo et al., Sanseido, Japanese-language dictionary, the 4th edition (compact version), Sanseido Co. Ltd.,, Mar. 1, 1992, p. 648, see also the section "Layer", 2 pages.
US2004/0263073 (A2) is the English equivalent for JP2005-019997 (A).
US2005/0040340 (A2) is the English equivalent for JP2004-239713 (A).
US2005/0067584 (A2) is the English equivalent for JP2005-125764 (A).
US2008/0150416 (A2) is the English equivalent for JP2008-135539 (A).
US5466947(A) is the English equivalent for JP H08-054500 (A).
WO2005/106926(A) is the English equivalent for JP2007-535175(A).
Decision of Rejection for Japanese Patent Application No. 2015-93844, dated Nov. 10, 2016, 5 pages (with English Translation).
English Translation of Search Report of Taiwanese Application No. 98138413, dated Mar. 25, 2015, 1 page.
International Search Report and Written Opinion in International Application No. PCT/US2009/064428 dated Jun. 28, 2010.
Notice of Reasons for Rejection from Japanese Patent Application No. 2011-536526 dated Nov. 6, 2013.
Official Action on Taiwanese Application No. 98138413, dated Mar. 25, 2015, 10 pages. (English translation not available.).
Preliminary Rejection received in Korean Patent Application No. 10-2011-7013272 dated Jun. 12, 2015, 17 pages with English Translation.
Supplementary European Search Report on European Application No. 09826852 dated Jan. 28, 2014, 5 pages.
Last Preliminary Rejection received for Korean Patent Application No. 10-2011-7013272 dated Nov. 27, 2015, with English translation, 11 pages.
Second Office Action and Search Report issued for Taiwan Application No. 98138413 dated Oct. 1, 2015, with English translation of Search Report only, 11 pages.
WO2004/077580 (A6) is the English equivalent for KR10-2005-0113200 (A3).
US2009/095265 (A2) is the English equivalent for TW200623459 (A7).
EP1418628 (A5) is the English equivalent for TW552726 (A11).
WO2008/19041 (A9) is the English equivalent for TW200814377 (A10).
US2006/027828 (A1) is the English equivalent for TW200625682 (A8).
Communication Pursuant to Article 94(3) EPC, for European Patent Application No. 09826852.7, dated Jul. 21, 2016, 7 pages.

Prior Art

PHOSPHOR-COATED LIGHT EXTRACTION STRUCTURES FOR PHOSPHOR-CONVERTED LIGHT EMITTING DEVICES

CROSS-REFERENCE TO RELATED APPLICATIONS

This application is a continuation of U.S. application Ser. No. 13/970,408, filed on Aug. 19, 2013, which is a divisional of U.S. application Ser. No. 12/617,680, filed on Nov. 12, 2009, which claims the benefit of U.S. Provisional Application Ser. No. 61/114,215, filed on Nov. 13, 2008, the disclosure of which are incorporated herein by reference in their entirety.

FIELD OF THE INVENTION

The invention relates generally to light emitting devices and more particularly to a thin-film phosphor deposition process for forming a thin-film phosphor layer adjacent to light extraction structures or adjacent to semiconductor light emitting devices.

BACKGROUND

Solid-State Lighting through Light Emitting Diodes (SSL-LEDs) involves the use of solid-state, inorganic semiconductor light emitting diodes to produce white light for illumination. Like inorganic semiconductor transistors, which displaced vacuum tubes for computation, SSL-LED is a disruptive technology that has the potential to displace vacuum or gas tubes used in traditional incandescent or fluorescent lighting. Advantages of SSL-LEDs over conventional light sources include: (1) higher efficiency and associated energy savings; (2) better color rendering; (3) small form factor; (4) ruggedness; (5) longer operational lifetime and low maintenance; (6) environmentally friendly; and (7) low fabrication costs.

Conventional LEDs typically generate monochromatic light with a narrow emission spectrum, and thus typically lack a broad emission spectrum to provide white light for illumination. In order to generate white light from an LED, a narrowband emission resulting from radiative recombination in the LED is transformed into broadband white light spectrum. Such broadband white light spectrum can be generated by three general approaches. A first approach is a wavelength-conversion approach by using an ultraviolet ("UV") LED to excite multi-color phosphors that emit visible light at down-converted wavelengths. A second approach is a color-mixing approach by combining multiple LEDs, each of which generates light of a different color. A third approach is a hybrid between the two approaches described above. The current generation of commercially available white LEDs is primarily based on this hybrid approach. In particular, primary light emitted from a blue InGaN-based LED is mixed with a down-converted secondary light emitted from a pale-yellow YAG:Ce$^{3+}$-based inorganic phosphor. The combination of partially transmitted blue and re-emitted yellow light gives the appearance of cool (green-blue) white light. Thus, phosphor coating technology is involved for white LEDs using either the wavelength-conversion approach or the hybrid approach.

Current approaches for phosphor coating are described next. A first approach, as depicted in FIG. 1A, is a slurry method involving the use of phosphor grains or particles 1 blended in a liquid polymer system, such as polypropylene, polycarbonate, epoxy resin, or silicone resin. The mixed phosphor slurry is dispensed on or surrounding an LED chip 2, and then the liquid polymer system is dried or cured. The LED chip 2 along with the phosphor slurry can be disposed in a reflector cup 3, as depicted in FIG. 1A. While the slurry method is a convenient phosphor dispensing method, a resulting color uniformity of LEDs manufactured with this slurry method is typically unsatisfactory, and colored rings can be observed from different viewing angles. These deficiencies are the result of: (1) variations in the thickness of a phosphor-containing material surrounding an LED chip can lead to various lengths of optical paths before an emitted light escapes a package; and (2) non-uniform phosphor distribution within the phosphor-containing material (because of gravity and buoyancy effects) tends to move larger phosphor particles downward during a liquid polymer curing process. Moreover, due to variations in the quantity of phosphor powders dispensed surrounding the LED chip, a white color coordinate tends to vary from device to device. These color variations, in turn, result in a complicated white LED color sorting process, the so-called color binning, which attempts to manage the color variations by sorting each device according to its white color coordinate.

To measure the uniformity of emitted light, the variation in a Correlated Color Temperature ("CCT") can be used. A color temperature of a light emitting device can be determined by comparing its hue with a theoretical, heated blackbody radiator. A temperature, expressed in terms of degrees Kelvin, at which the heated blackbody radiator matches the hue of the light emitting device is that device's color temperature. An incandescent light source can be close to being a blackbody radiator, but many other light emitting devices do not emit radiation in the form of a blackbody curve and are, therefore, assigned a CCT. A CCT of a light emitting device is a color temperature of a blackbody radiator that most closely matches the device's perceived color. The higher the Kelvin rating, the "cooler" or more blue the light. The lower the Kelvin rating, the "warmer" or more yellow the light. By measuring the CCT at different light emission angles and comparing this variation among different light emitting devices, the uniformity of the light produced can be quantified. A blue LED chip dispensed with a yellow phosphor by the slurry method can have a typical CCT that varies from about 5,800 K to about 7,200 K across a range of 1,400 K for light emission angles at ±70° from a center light-emitting axis of the LED. Because of the presence of colored rings, the CCT is typically higher at or near the center axis than in the periphery, where the emitted light tends to be more yellow.

A second phosphor coating method is an Electrophoretic Deposition ("EPD") method for the manufacture of phosphor-converted white LEDs, as depicted in FIG. 1B. In the case of EPD, a phosphor is electrically charged by adding a proper amount of an electrolyte in a liquid solvent to form a liquid suspension, and is biased by an electrical field. Then, surface charged phosphor particles are moved to an electrode of counter-polarity and coated on the electrode. EPD of the phosphor particles creates a phosphor layer 4 of relatively uniform thickness that can produce white light of greater uniformity and reduced instances of colored rings. While achieving greater color uniformity, the EPD method is generally lacking in its ability to deposit phosphors directly over an electrically nonconductive surface. In commercial production, a phosphor layer is typically coated directly over a LED chip 5, according to the so-called proximate phosphor configuration. This configuration tends to be inefficient in terms of light scattering, since the proximate phosphor layer can direct about 60% of total white light emission back towards the LED chip 5, where high loss can occur. Another drawback of the EPD method is that certain phosphors are susceptible to degradation by the solvent, thereby limiting the general applicability of the EPD method.

More recently and as depicted in FIG. 2, another approach involves forming a luminescent ceramic plate 6 by heating phosphor particles at high pressure until surfaces of the phosphor particles begin to soften and melt. The partially melted particles can stick together to form the ceramic plate 6 including a rigid agglomerate of the particles. The luminescent ceramic plate 6 is disposed in a path of light emitted by an LED chip 7, which is disposed over a set of electrodes 8. While providing benefits in terms of robustness, reduced sensitivity to temperature, and reduced color variations from chip to chip, a resulting package efficiency can be unsatisfactory due to the proximate phosphor configuration.

A scattering efficiency (also sometimes referred to as a package efficiency) is typically between 40% to 60% for commercially available white LEDs, with efficiency losses due to light absorption by internal package components such as an LED chip, a lead frame, or sub-mount. FIG. 3 depicts an example of a phosphor-converted white LED with yellow phosphor 31 powered by a blue LED chip 32, where a primary blue light 34 undergoing color mixing with a secondary light 35 of yellow color to generate a white color. A main source of light loss results from absorption of light by the LED chip 32. Because the LED chip 32 is typically formed of high-refractive index materials, photons tend to be trapped within the LED chip 32 due to Total Internal Reflection ("TIR") once the photons strike and enter the LED chip 32. Another potential source of light loss results from imperfections in a mirror reflector 33 in the LED package.

Several scenarios depicted in FIG. 3 can direct light to the highly absorbent LED chip 32. First, a primary light 36 emitted by the LED chip 32 can be reflected back to the chip 32 by the phosphor powders 31 or by the mirror reflector 33. Second, down-converted secondary light 37 emitted by the phosphor powders 31 can scatter backward towards the LED chip 32. Third, both primary light and secondary light 38 can be reflected back towards the chip 32 due to TIR at an air-LED package interface. To improve the probability of light escaping from the package, a hemispheric lens 39 can be used to reduce instances of TIR at the air-package interface. To reduce instances of backward scattered light striking the LED chip 32, the phosphor powders 31 desirably should not be placed directly over the chip surface, but rather should be placed at a certain distance from the LED chip 32. Furthermore, a thinner phosphor layer would reduce instances of backward scattering of secondary light by the phosphor powders 31.

It is against this background that a need arose to develop the thin-film phosphor deposition process and related devices and systems described herein.

SUMMARY

Certain embodiments of the invention relate to producing a high-efficiency white light emitting device incorporating a thin-film phosphor layer. Because a light emitting semiconductor device, such as an LED, is typically formed of a high refractive index material, a light extraction structure is desirably incorporated to reduce TIR of light within an LED package. The light extraction structure can involve using, for example, a hemispherical lens, a microlens array, or a Fresnel lens. The light extraction structure is typically formed of an optically transparent or translucent material, which is typically electrically nonconductive. As contrasted to EPD, a deposition method of a thin-film phosphor layer disclosed herein can be used to form conformal thin-film phosphor layers directly over an electrically nonconductive surface as well as an electrically conductive surface. The conformal thin-film phosphor layer also can be deposited over a flat surface as well as a non-flat surface, such as a convex or concave surface.

Some embodiments of the invention relate to producing a high-efficiency phosphor-converted light emitting device by disposing a conformal thin-film phosphor layer over a light extraction lens structure. Specifically, one embodiment involves producing a phosphor-coated lens by directly depositing a thin-film phosphor layer on an electrically nonconductive light extraction lens structure, such as a hemispherical lens formed of epoxy, silicone, poly(methyl methacrylate), polycarbonate, glass, or a quartz material. The lens structure coated with the thin-film phosphor layer can be connected to an LED to produce a high-efficiency remote phosphor configuration. An air gap can be included for this remote phosphor configuration to increase the light extraction efficiency.

Some embodiments of the invention relate to producing a phosphor microlens by depositing a thin-film phosphor layer over a microlens array. The phosphor-coated microlens array can be laminated over a light emitting device to form a high-efficiency phosphor-converted light emitting device.

Some embodiments of the invention relate to producing a phosphor-coated Fresnel lens by depositing a thin-film phosphor layer over a Fresnel lens. The phosphor-coated Fresnel lens can be laminated over a light emitting device to form a high-efficiency phosphor-converted light emitting device.

Some embodiments of the invention relate to disposing a substantially planar thin-film phosphor layer over an optical path of a light emitting device. For certain LED applications such as backlighting for Liquid Crystal Displays ("LCDs"), a small etendue light beam emitted from a light emitting device is involved. Along this regard, some embodiments of the invention relate to producing a substantially planar thin-film phosphor layer that is disposed over a substantially planar surface of a light emitting device. One specific embodiment involves disposing a thin-film phosphor layer directly over a surface of a light emitting device. Another embodiment involves disposing a thin-film phosphor layer over a light emitting device with an optically transparent or translucent planar spacer layer disposed in between.

According to some embodiments of the invention, a photonic crystal array structure is effective as a light extraction mechanism for light emitting devices producing a small etendue light beam. In particular, certain embodiments involve producing a high-efficiency phosphor-converted photonic crystal light emitting device by disposing a substantially planar thin-film phosphor layer over a surface of a photonic crystal array structure, such as a two-dimensional photonic crystal array structure.

One specific embodiment of the invention relates to a phosphor-coated light extraction structure, which includes: (1) a light extraction structure including a coating surface; and (2) a thin-film phosphor layer including at least one phosphor powder layer and at least one polymer layer serving as a binder for the at least one phosphor powder layer, wherein the thin-film phosphor layer is conformally disposed adjacent to the coating surface of the light extraction structure.

Another specific embodiment of the invention relates to a phosphor-converted light emitting device, which includes: (1) a light emitting device; and (2) a thin-film phosphor layer disposed in an optical path of the light emitting device, wherein a thickness of the thin-film phosphor layer is in the range of 1 nm to 100 μm, and the thin-film phosphor layer includes: (a) a first phosphor powder layer including first phosphor particles; and (b) a first polymer layer adjacent to the first phosphor powder layer, the first polymer layer serving as a binder for the first phosphor particles.

Another specific embodiment of the invention relates to a method of forming phosphor-converted light emitting devices. The method includes: (1) providing a packaging substrate including an array of submount reflectors, which can be an array of reflector cups; (2) connecting light emitting devices to respective submount reflectors of the packaging substrate; (3) providing a phosphor-coated microlens array; (4) connecting the phosphor-coated microlens array to the packaging substrate; and (5) dicing the packaging substrate to form individual phosphor-converted light emitting devices.

Another specific embodiment of the invention relates to a method of forming a phosphor-converted light emitting device. The method includes: (1) forming a thin-film phosphor layer adjacent to a hemispherical lens, the thin-film phosphor layer including a parylene-based polymer as a binder material; and (2) connecting the phosphor-coated hemispherical lens to a light emitting device.

Another specific embodiment of the invention relates to a method of forming a phosphor-converted light emitting device. The method includes: (1) forming a thin-film phosphor layer adjacent to a microlens array, the thin-film phosphor layer including a parylene-based polymer as a binder material; and (2) connecting the phosphor-coated microlens array to a light emitting device.

A further specific embodiment of the invention relates to a method of forming a phosphor-converted light emitting device. The method includes: (1) forming a thin-film phosphor layer including a parylene-based polymer; and (2) connecting the thin-film phosphor layer to a photonic crystal light emitting device.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

FIG. 12A through FIG. 13B depict a wafer-level, batch packaging process for light emitting devices, according to an embodiment of the invention.

DETAILED DESCRIPTION

Definitions

Figure 1A:
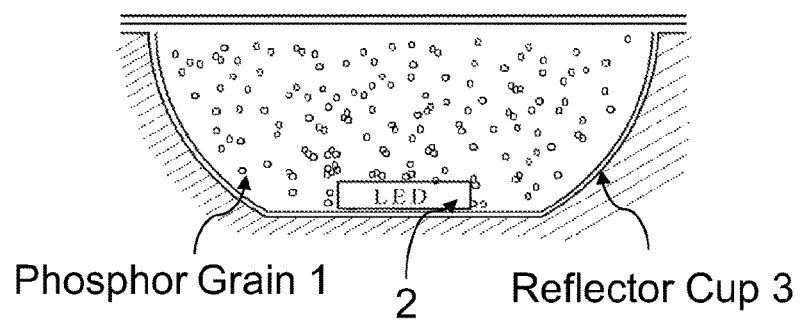
FIG. 1A depicts a proximate phosphor-in-cup configuration of a conventional white LED formed using a slurry method.
Figure 1B:
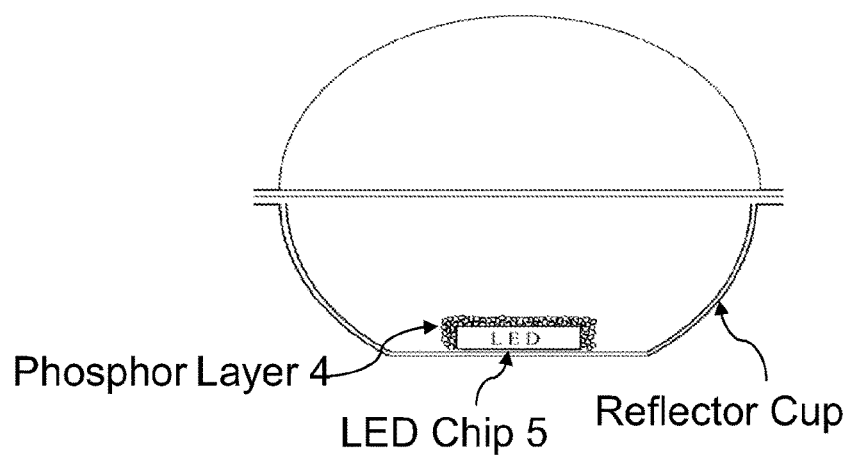
FIG. 1B depicts a proximate phosphor configuration of a conventional white LED formed using EPD.
Figure 2:
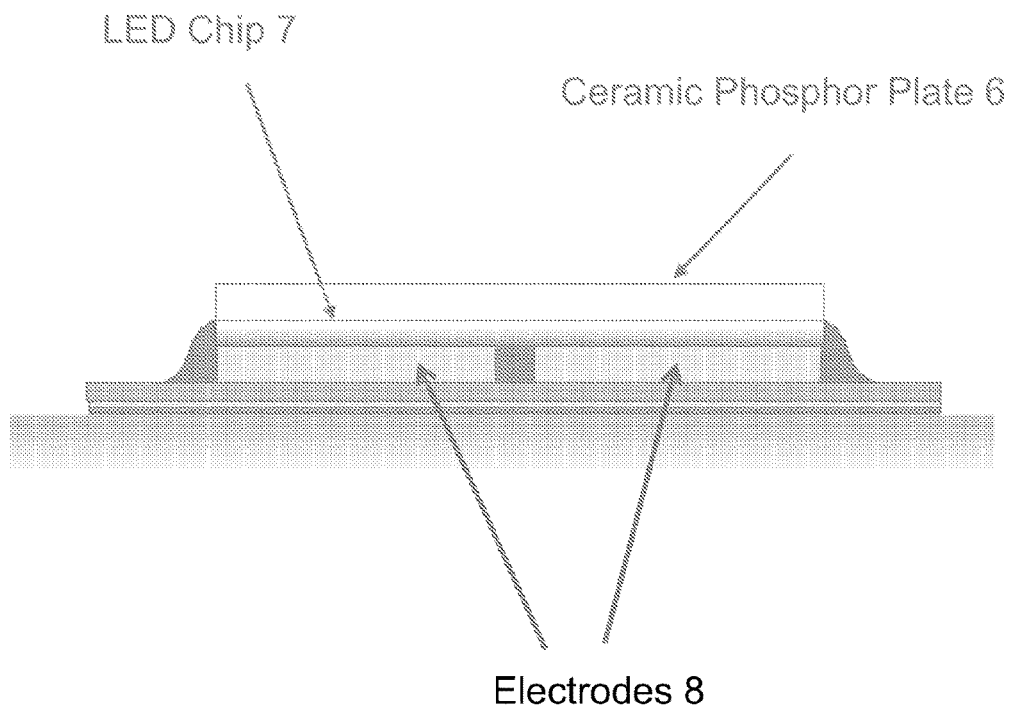
FIG. 2 depicts a proximate phosphor configuration of a conventional white LED formed by lamination with a luminescent ceramic plate.
Figure 3:
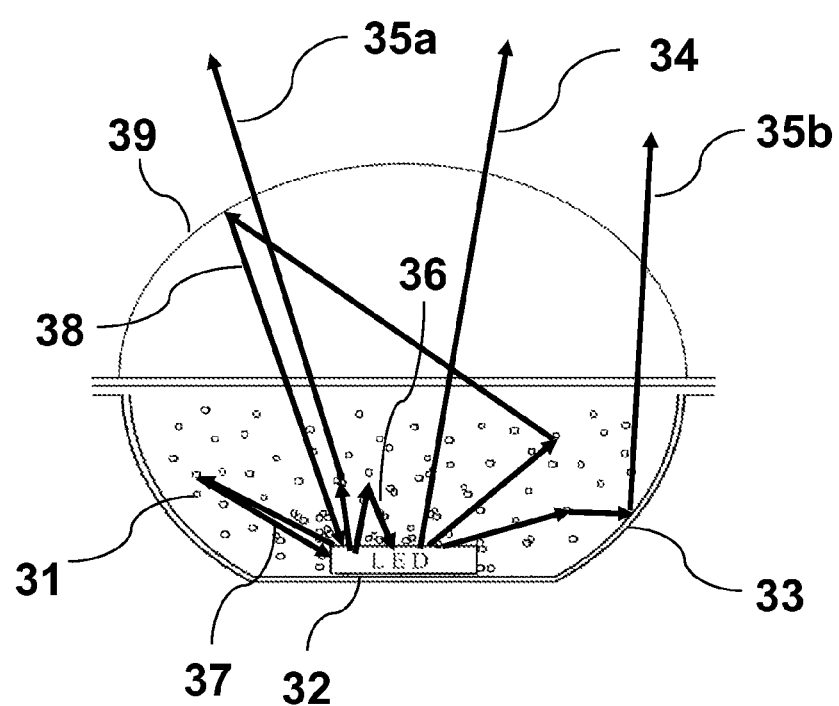
FIG. 3 depicts typical sources of light losses, including light scattering by phosphor particles, TIR at material interfaces, and light absorption at a surface of a light emitting device.

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining Adjacent components can be spaced apart from one another or can be in actual or direct contact with one another. In some instances, adjacent components can be connected to one another or can be formed integrally with one another.

As used herein, the terms "connect," "connected," and "connection" refer to an operational coupling or linking Connected components can be directly coupled to one another or can be indirectly coupled to one another, such as via another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current, while the terms "electrically nonconductive" and "electrical nonconductivity" refer to a lack of ability to transport an electric current. Electrically conductive materials typically correspond to those materials that exhibit little or no opposition to flow of an electric current, while electrically nonconductive materials typically correspond to those materials within which an electric current has little or no tendency to flow. One measure of electrical conductivity (or electrical nonconductivity) is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$, while an electrically nonconductive material is one having a conductivity less than about $10^4$ $S \cdot m^{-1}$, such as less than or equal to about $10^3$ $S \cdot m^{-1}$ or less than or equal to about $10^2$ $S \cdot m^{-1}$. Electrical conductivity (or electrical nonconductivity) of a material can sometimes vary with temperature. Unless otherwise specified, electrical conductivity (or electrical nonconductivity) of a material is defined at room temperature.

As used herein with respect to photoluminescence, the term "quantum efficiency" refers to a ratio of the number of output photons to the number of input photons.

As used herein, the term "size" refers to a characteristic dimension. In the case of a particle that is spherical, a size of the particle can refer to a diameter of the particle. In the case of a particle that is non-spherical, a size of the particle can refer to an average of various orthogonal dimensions of the particle. Thus, for example, a size of a particle that is a spheroidal can refer to an average of a major axis and a minor axis of the particle. When referring to a set of particles as having a particular size, it is contemplated that the particles can have a distribution of sizes around that size. Thus, as used herein, a size of a set of particles can refer to a typical size of a distribution of sizes, such as an average size, a median size, or a peak size.

As used herein, the term "alkane" refers to a saturated hydrocarbon molecule. For certain applications, an alkane can include from 1 to 100 carbon atoms. The term "lower alkane" refers to an alkane that includes from 1 to 20 carbon atoms, such as, for example, from 1 to 10 carbon atoms, while the term "upper alkane" refers to an alkane that includes more than 20 carbon atoms, such as, for example, from 21 to 100 carbon atoms. The term "branched alkane" refers to an alkane that includes one or more branches, while the term "unbranched alkane" refers to an alkane that is straight-chained. The term "cycloalkane" refers to an alkane that includes one or more ring structures. The term "heteroalkane" refers to an alkane that has one or more of its carbon atoms replaced by one or more heteroatoms, such as, for example, N, Si, S, O, and P. The term "substituted alkane" refers to an alkane that has one or more of its hydrogen atoms replaced by one or more substituent groups, such as, for example, halo groups, hydroxy groups, alkoxy groups, carboxy groups, thio groups, alkylthio groups, cyano groups, nitro groups, amino groups, alkylamino groups, dialkylamino groups, silyl groups, and siloxy groups, while the term "un-substituted alkane" refers to an alkane that lacks such substituent groups. Combinations of the above terms can be used to refer to an alkane having a combination of characteristics. For example, the term "branched lower alkane" can be used to refer to an alkane that includes from 1 to 20 carbon atoms and one or more branches. Examples of alkanes include methane, ethane, propane, cyclopropane, butane, 2-methylpropane, cyclobutane, and charged, hetero, or substituted forms thereof.

As used herein, the term "alkyl group" refers to a monovalent form of an alkane. For example, an alkyl group can be envisioned as an alkane with one of its hydrogen atoms removed to allow bonding to another group of a molecule. The term "lower alkyl group" refers to a monovalent form of a lower alkane, while the term "upper alkyl group" refers to a monovalent form of an upper alkane. The term "branched alkyl group" refers to a monovalent form of a branched alkane, while the term "unbranched alkyl group" refers to a monovalent form of an unbranched alkane. The term "cycloalkyl group" refers to a monovalent form of a cycloalkane, and the term "heteroalkyl group" refers to a monovalent form of a heteroalkane. The term "substituted alkyl group" refers to a monovalent form of a substituted alkane, while the term "un-substituted alkyl group" refers to a monovalent form of an unsubstituted alkane. Examples of alkyl groups include methyl, ethyl, n-propyl, isopropyl, cyclopropyl, butyl, isobutyl, t-butyl, cyclobutyl, and charged, hetero, or substituted forms thereof.

As used herein, the term "arene" refers to an aromatic hydrocarbon molecule. For certain applications, an arene can include from 5 to 100 carbon atoms. The term "lower arene" refers to an arene that includes from 5 to 20 carbon atoms, such as, for example, from 5 to 14 carbon atoms, while the term "upper arene" refers to an arene that includes more than 20 carbon atoms, such as, for example, from 21 to 100 carbon atoms. The term "monocyclic arene" refers to an arene that includes a single aromatic ring structure, while the term "polycyclic arene" refers to an arene that includes more than one aromatic ring structure, such as, for example, two or more aromatic ring structures that are bonded via a carbon-carbon single bond or that are fused together. The term "heteroarene" refers to an arene that has one or more of its carbon atoms replaced by one or more heteroatoms, such as, for example, N, Si, S, O, and P. The term "substituted arene" refers to an arene that has one or more of its hydrogen atoms replaced by one or more substituent groups, such as, for example, alkyl groups, alkenyl groups, alkynyl groups, iminyl groups, halo groups, hydroxy groups, alkoxy groups, carboxy groups, thio groups, alkylthio groups, cyano groups, nitro groups, amino groups, alkylamino groups, dialkylamino groups, silyl groups, and siloxy groups, while the term "un-substituted arene" refers to an arene that lacks such substituent groups. Combinations of the above terms can be used to refer to an arene having a combination of characteristics. For example, the term "monocyclic lower alkene" can be used to refer to an arene that includes from 5 to 20 carbon atoms and a single aromatic ring structure. Examples of arenes include benzene, biphenyl, naphthalene, pyridine, pyridazine, pyrimidine, pyrazine, quinoline, isoquinoline, and charged, hetero, or substituted forms thereof.

As used herein, the term "aryl group" refers to a monovalent form of an arene. For example, an aryl group can be envisioned as an arene with one of its hydrogen atoms removed to allow bonding to another group of a molecule. The term "lower aryl group" refers to a monovalent form of a lower arene, while the term "upper aryl group" refers to a monovalent form of an upper arene. The term "monocyclic aryl group" refers to a monovalent form of a monocyclic arene, while the term "polycyclic aryl group" refers to a monovalent form of a polycyclic arene. The term "heteroaryl group" refers to a monovalent form of a heteroarene. The term "substituted aryl group" refers to a monovalent form of a substituted arene, while the term "un-substituted arene group" refers to a monovalent form of an unsubstituted arene. Examples of aryl groups include phenyl, biphenylyl, naphthyl, pyridinyl, pyridazinyl, pyrimidinyl, pyrazinyl, quinolyl, isoquinolyl, and charged, hetero, or substituted forms thereof.

As used herein, the term "arylene group" refers to a bivalent form of an arene. For example, an arylene group can be envisioned as an arene with two of its hydrogen atoms removed to allow bonding to one or more additional groups of a molecule. The term "lower arylene group" refers to a bivalent form of a lower arene, while the term "upper arylene group" refers to a bivalent form of an upper arene. The term "monocyclic arylene group" refers to a bivalent form of a monocyclic arene, while the term "polycyclic arylene group" refers to a bivalent form of a polycyclic arene. The term "heteroarylene group" refers to a bivalent form of a heteroarene. The term "substituted arylene group" refers to a bivalent form of a substituted arene, while the term "un-substituted arylene group" refers to a bivalent form of an unsubstituted arene. Examples of arylene groups include phenylene, biphenylylene, naphthylene, pyridinylene, pyridazinylene, pyrimidinylene, pyrazinylene, quinolylene, isoquinolylene, and charged, hetero, or substituted forms thereof.

Conformal Thin-Film Phosphor Deposition Process

Certain embodiments of the invention relate to the formation of a thin-film phosphor layer of substantially uniform thickness that can be conformally disposed in an optical path of a light emitting device, such as an LED, thereby producing substantially uniform white light with little or no colored rings. This thin-film phosphor layer can be prepared by an improved deposition method involving: (1) forming a phosphor powder layer that is substantially uniformly deposited on a substrate surface; and (2) forming a polymer binder layer to fill gaps among loosely packed phosphor particles, thereby forming a substantially continuous, thin-film phosphor layer. Phosphor conversion efficiency of the thin-film phosphor layer can be significantly improved because a thinner layer of a precisely controlled quantity of phosphor powders can be disposed in an optical path, thereby reducing light scattering losses. Also, color homogeneity of the thin-film phosphor layer can be significantly improved due to substantially uniform deposition of phosphor particles. One method of forming an uniform, thin-film phosphor layer is to introduce electrostatic charges among phosphor particles during deposition of the phosphor particles. The electrostatic charges among the phosphor particles can self-balance and adjust their distribution, thereby promoting a substantially uniform distribution of the phosphor particles. Another method of forming an uniform, thin-film phosphor layer is through a phosphor dispensing mechanism, such as a showerhead mechanism in a deposition chamber, or through a rotational substrate holding mechanism, such as a turn table that holds a substrate. In addition to improved efficiency and color homogeneity, temperature stability of the thin-film phosphor layer can be significantly improved because the polymer binder layer can be thermally stable up to at least about 300° C. or more.

Advantageously, white color consistency can be maintained in a tight color coordinate by a coating process with precisely controlled quantities of deposited phosphor particles through a phosphor powder delivery mechanism. White color rendering can be precisely tuned with a layer-by-layer sequential deposition of multi-color phosphors, such as deposition of a red phosphor layer, deposition of a green phosphor layer, and then deposition of a blue phosphor layer. The ratio of multi-color phosphors can be precisely controlled in a resulting composite multi-color phosphor film stack. Thus, the color coordinate and CCT of a white LED fabricated by the phosphor thin-film process can be precisely controlled. This, in turn, can significantly simplify (or even avoid) a binning process.

According to some embodiments of the invention, a consistent white color coordinate can be achieved from lightly varied blue LED chips by tuning the dosage of a multi-color phosphor film stack. This color compensation method can compensate for color variations of the blue LED chips using different compositions or amounts of phosphor contents. In such manner, white LED yield can be significantly increased for color sensitive applications, such as display backlighting using white LEDs.

According to one embodiment of the invention, a thin-film phosphor coating method is a batch phosphor coating process. Multiple light emitting devices can be deposited with thin-film phosphor in one coating operation. According to another embodiment of the invention, multiple LED lenses can be deposited with thin-film phosphor in one coating operation. Similar to semiconductor chip manufacturing, a manufacturing cost per light emitting device can be significantly reduced, and a manufacturing throughput can be significantly increased by a batch process. The deposition process of forming the thin-film phosphor layer is desirably held in a vacuum chamber. However, it will be appreciated that the deposition process also can take place in a deposition chamber filled with an inert gas, such as nitrogen, or in an atmospheric environment.

As contrasted to EPD, deposition of a thin-film phosphor layer can be used to form conformal thin-film phosphor layers directly over an electrically nonconductive surface. The conformal thin-film phosphor also can be deposited on a non-flat surface, such as a convex or concave surface of an LED lens.

In accordance with the improved process, a variety of phosphors can be used. Typically, a phosphor is formed from a luminescent material, namely one that emits light in response to an energy excitation. Luminescence can occur based on relaxation from excited electronic states of atoms or molecules and, in general, can include, for example, chemiluminescence, electro luminescence, photoluminescence, thermoluminescence, triboluminescence, and combinations thereof. For example, in the case of photoluminescence, which can include fluorescence and phosphorescence, an excited electronic state can be produced based on a light excitation, such as absorption of light. Phosphors useful in accordance with the improved process include a variety of inorganic host materials doped by activator ions such as $Ce^{3+}$ and $Eu^{2+}$, including garnets (e.g., $(Y_{1-a}Gd_a)_3(Al_{1-b}Ga_b)_5O_{12}:Ce^{3+}$ with a, b≤0.2 or YAG:$Ce^{3+}$), silicates, orthosilicates, sulfides, and nitrides. Garnets and orthosilicates can be used as yellow-emitting phosphors, and nitrides can be used as red-emitting phosphors. However, it will be appreciated that various other types of wavelength-conversion materials can be used, including organic dyes. Desirably, phosphors and other types of wavelength-conversion materials can exhibit photoluminescence with a quantum efficiency that is greater than about 30 percent, such as at least about 40 percent, at least about 50 percent, at least about 60 percent, at least about 70 percent, or at least about 80 percent, and can be up to about 90 percent or more.

Typically, a phosphor used in accordance with the improved process is provided in a powder form, namely as a set of particles. To enhance color uniformity, the particles desirably have sizes in the range of about 1 nm to about 100 μm, such as from about 10 nm to about 30 μm, from about 100 nm to about 30 μm, from about 500 nm to about 30 μm, or from about 1 μm to about 30 μm.

In accordance with the phosphor deposition process, the phosphor powder can be transported and deposited over the substrate surface by inertia effects, Brownian movement, thermophoresis, or electrical fields if the phosphor powder is electrically charged. One approach to form a substantially uniformly distributed phosphor powder layer on the substrate surface is to entrain, carry, mobilize, or transport the phosphor powder from a phosphor canister by a set of carrier gases, such as clean, dry air or an inert gas such as nitrogen, and then spray the phosphor powder through a showerhead mechanism in a vacuum, inert gas, or atmospheric chamber. For some embodiments, it is desirable that the phosphor powder is ionized with the same positive or negative electrostatic charge during the phosphor transport process. When the charged phosphor powder is sprayed and deposited on the substrate surface, the constituent phosphor particles are substantially uniformly distributed to form a phosphor powder layer resulting from self-balancing of electrostatic forces among the phosphor particles. Specifically, electrostatic spraying of the phosphor powder involves:

1) The phosphor powder is transported by an inert carrier gas from a phosphor powder canister or other phosphor powder source. Phosphor powder flow volume can be precisely controlled by a nozzle device or other flow control mechanism.

2) The phosphor powder is ionized with the same electrostatic charge. The operation of ionizing the phosphor powder is desirable to substantially uniformly deposit the phosphor powder on the substrate surface. It will be appreciated, however, that this powder ionization operation is optional, and can be omitted for certain embodiments.

3) If the substrate surface is formed of an electrically nonconductive polymer material, the substrate surface is ionized with an opposite electrostatic charge on the substrate surface. If the substrate surface is formed of an electrically conductive material, the substrate surface is grounded, such as by electrically connecting the substrate surface to a ground potential. The operation of ionizing or grounding the substrate surface is desirable to substantially uniformly deposit the phosphor powder on the substrate surface. It will be appreciated, however, that this substrate surface ionizing or grounding operation is optional, and can be omitted for certain embodiments.

4) The carrier gas entrains the charged phosphor powder to the deposition chamber through a showerhead mechanism, thereby evenly distributing the phosphor powder. The showerhead mechanism is desirable to substantially uniformly deposit the phosphor powder on the substrate surface. Alternatively, or in conjunction, the substrate surface is rotated in the deposition chamber using a rotational mechanism so that the phosphor powder can be substantially uniformly deposited on the substrate surface. It will be appreciated, however, that these mechanisms are optional, and can be omitted for certain embodiments.

5) The phosphor powder is conformally and substantially uniformly deposited onto the substrate surface. In one embodiment, the substrate surface is a surface of an LED chip or surfaces of multiple LED chips. In another embodiment, the substrate surface is a surface of an LED lens or surfaces of multiple LED lenses. In another embodiment, the substrate surface is a surface of a glass or quartz substrate. In another embodiment, the substrate surface is a surface of a flexible transparent film, such as one formed of poly(ethylene terephthalate).

6) The phosphor powder is discharged with ionizing (or de-ionizing) gas. The ionizing gas neutralizes residual electrostatic charges on the phosphor power. It will be appreciated that this discharging operation is optional, and can be omitted for certain embodiments.

In accordance with the phosphor deposition process, the phosphor powder is ionized with electrostatic charges by one, or a combination, of the following methods:

Corona charging where electric power is used to generate the electrostatic charges Triboelectric charging where the electrostatic charges are generated by friction between the powder and some conduit surface Induction charging where the powder is charged by induction from an electrical field For an electrically conductive substrate, the substrate surface can be grounded to maintain an electric field potential for the deposition of the electrostatically charged phosphor powder. Electrostatic charges also can be created on the phosphor powder or an electrically nonconductive substrate surface by Tribo frictional charging. In particular, when two different materials are brought into contact, there can be a transfer of charge from one to the other to offset an imbalance of charges. The magnitude and direction of the charge transfer can depend on a number of factors, including a chemical and electronic structure of both materials.

An opposite electrostatic charge can be created on an electrically nonconductive substrate surface with the Tribo frictional charging method. For example, negative charges can be created on the nonconductive substrate surface by one, or a combination, of the following:

Tribo frictional charging is carried out using a Teflon powder blown through a nonconductive epoxy or silicone resin surface. The Teflon powder can carry electrons away from the epoxy or silicone resin surface to render the surface negatively charged.

An epoxy surface is rubbed with a Nylon brush or cloth.

The phosphor deposition process provides a number of advantages, including:

It can be applied to both a near phosphor configuration and a remote phosphor configuration for phosphor-converted white LEDs.

It can be implemented as a layer-by-layer phosphor deposition process, and can be readily used to form a multi-color phosphor thin-film stack.

The deposition process can be a dry and clean process, without any solvents.

Controlled quantities of phosphors can be used during deposition, thereby significantly reducing color variations and binning issues of white LEDs.

It can achieve a substantially uniform coating of phosphors by introducing electrostatic charges among phosphor particles.

It can achieve a high phosphor utilization yield during deposition.

In accordance with the phosphor deposition process, the deposited phosphor layer is initially a loosely packed powder layer. Next, a polymer thin film is deposited to fill gaps among phosphor particles and to form a substantially continuous thin-film layer. To preserve the substantially uniformly distributed phosphor layer structure, it is desirable to use a Chemical Vapor Deposition ("CVD") process to form this polymer layer as a binder material for the phosphor particles. It will be appreciated that another suitable deposition process can be used in place of, or in conjunction with, CVD to form the polymer layer. Examples of other deposition processes include other vapor deposition processes, such as thermal evaporation, electron-beam evaporation, or physical vapor deposition, as well as spray coating, dip coating, web coating, wet coating, and spin coating.

Examples of suitable polymers include a family of conformal coating polymers that can be used to form a binding matrix for a thin-film phosphor layer, according to an embodiment of the invention. In particular, the family of polymers corresponds to a family of parylene-based polymers. Generally, parylene-based polymers correspond to a variety of polyxylylene-based polymers, such as poly(p-xylylene) and its derivatives, and include, for example, polymers having a general repeating unit of the formula —CZZ'-Ar—CZ"Z'"—, wherein Ar is an arylene group (e.g., un-substituted, partially substituted, or fully substituted arylene group, such as phenylene), and wherein Z, Z', Z", and Z'" can be the same or different. In specific embodiments, Ar is $C_6H_{4-x}X_x$, wherein X is a halogen such as Cl or F, x=0, 1, 2, 3, or 4, and Z, Z', Z", and Z'" are independently selected from H, F, alkyl groups, and aryl groups (e.g., $C_6H_{5-x}F_x$ with x=0, 1, 2, 3, 4, or 5). In one specific embodiment, Parylene N includes a repeating unit of the formula —$CH_2$—$C_6H_4$—$CH_2$—, and is used as a binder material to form a thin-film phosphor layer. In another embodiment, Parylene C including a repeating unit of the formula —$CH_2$—$C_6H_3Cl$—$CH_2$— is used as a binder material to form a thin-film phosphor layer. Parylene C can be produced from the same monomer as Parylene N, but modified with the substitution of a chlorine atom for one of the aromatic hydrogens. In another embodiment, Parylene D including a repeating unit of the formula —$CH_2$—$C_6H_2Cl_2$—$CH_2$— is used as a binder material to form a thin-film phosphor layer. Parylene D can be produced from the same monomer as Parylene N, but modified with the substitution of two chlorine atoms for two of the aromatic hydrogens. In another embodiment, a partially fluorinated parylene-based polymer referred to as Parylene F can be used. Parylene F includes a repeating unit of the formula —$CF_2$—$C_6H_4$—$CF_2$—, and can be formed from various precursors, such as $BrCF_2$—$C_6H_4$—$CF_2Br$. It will be appreciated that these parylene-based polymers are provided by way of example, and a variety of other conformal coating polymers can be used. Examples of other suitable polymers include polyimides, fluorocarbon-based polymers (e.g., poly(tetrafluoroethylene)), poly(p-phenylene vinylene), poly(pyrrole), poly(thiophene), poly(2,4-hexadiyn-1,6-diol), fluorocarbon/organosilicon copolymers, poly(ethylene glycol), and their derivatives. Thermal evaporation of acrylics also can be used to form a substantially continuous phosphor film.

Various parylene-based polymer films and other types of polymer films can be formed via a CVD technique of transport polymerization. Transport polymerization typically involves generating a vapor phase reactive intermediate from a precursor molecule at a location remote from a substrate surface, and then transporting the vapor phase reactive intermediate to the substrate surface. The substrate surface can be kept below a melting temperature of reactive intermediates for polymerization. For example, Parylene F can be formed from the precursor $BrCF_2$—$C_6H_4$—$CF_2Br$ by the removal of the bromine atoms to form the reactive intermediate *$CF_2$—$C_6H_4$—$CF_2$*, wherein * denotes a free radical. This reactive intermediate can be formed at a location remote from a deposition chamber, and can be transported into the deposition chamber and condensed over the substrate surface, where polymerization takes place.

More generally, parylene-based polymer films can be formed from a variety of precursors, such as those having the formula $(CZZ'Y)_m$-Ar-$(CZ"Z'"Y')_n$, wherein Ar is an arylene group (e.g., un-substituted, partially substituted, or fully substituted arylene group, such as phenylene), Z, Z', Z", and Z'" can be the same or different, Y and Y' can be the same or different and are removable to generate free radicals, m and n are each equal to zero or a positive integer, and a sum of m and n is less than or equal to a total number of $sp^2$-hybridized carbons on Ar available for substitution. In specific embodiments, Ar is $C_6H_{4-x}X_x$, wherein X is a halogen such as Cl or F, x=0, 1, 2, 3, or 4, and Z, Z', Z", and Z'" are independently selected from H, F, alkyl groups, and aryl groups (e.g., $C_6H_{5-x}F_x$ with x=0, 1, 2, 3, 4, or 5). Other suitable precursors include dimers having the formula $\{(CZZ')$-Ar-$(CZ"Z'")\}_2$, wherein Ar is an arylene group (e.g., un-substituted, partially substituted, or fully substituted arylene group, such as phenylene), and Z, Z', Z", and Z'" can be the same or different. In specific embodiments, Ar is $C_6H_{4-x}X_x$, wherein X is a halogen such as Cl or F, x=0, 1, 2, 3, or 4, and Z, Z', Z", and Z'" are independently selected from H, F, alkyl groups, and aryl groups (e.g., $C_6H_{5-x}F_x$ with x=0, 1, 2, 3, 4, or 5).

One aspect of a parylene-based polymer film, or another type of polymer film, prepared by the CVD method is that it is a conformal coating with superior crevice penetration capability, thereby substantially filling gaps and voids within a phosphor powder layer. In some instances, Parylene F can achieve the best result for gap-filling, while Parylene N can achieve the second best result for gap-filling among the family of parylene-based polymers. Another aspect of a parylene-based polymer is that it has superior optical transparency in the visible light spectrum, rendering it a suitable filler material among a photoluminescent phosphor powder. Another aspect of a parylene-based polymer is that its refractive index can be adjusted based on chemical composition. In one embodiment, a multi-layer of parylene-based polymer films can be formed as a composite thin-film phosphor stack. This multi-layer structure can be formed by depositing a Parylene N film, with a refractive index of about 1.66, as a binder material among a phosphor powder, and then depositing a Parylene F film, with a refractive index of about 1.4, thereby enhancing light extraction due to index matching of the Parylene F film to ambient environment (e.g., air). It will be appreciated that, in general, this multi-layer structure can be formed by depositing a first polymer film, with a first refractive index, as a binder material among a first phosphor powder layer to form a first phosphor layer adjacent to the substrate surface, depositing a second polymer film, with a second refractive index, as a binder material among a second phosphor powder layer to form a second phosphor layer adjacent to the first phosphor layer, and so on, where the first refractive index is greater than or equal to the second refractive index.

Using the CVD method, a parylene-based polymer, or another type of polymer, can be formed as a substantially continuous film having a thickness in the range of a few tens of angstroms to about 100 µm, such as from about 1 nm to about 100 µm, from about 10 nm to about 100 µm, from about 100 nm to about 100 µm, from about 1 µm to about 100 µm, from about 1 µm to about 75 µm, from about 1 µm to about 30 µm, or from about 1 µm to about 10 µm. In some instances, the thickness of the film can exhibit a standard deviation of less than about 20 percent with respect to an average thickness, such as less than about 10 percent or less than about 5 percent. A thickness of the initially deposited phosphor powder layer can be in the range of about 1 nm to about 60 µm, such as from about 10 nm to about 60 µm, from about 100 nm to about 40 µm, or from about 100 nm to about 20 µm. In some instances, the thickness of the phosphor powder layer can exhibit a standard deviation of less than about 20 percent with respect to an average thickness, such as less than about 10 percent or less than about 5 percent. A distribution of the phosphor powder within the resulting film can be substantially uniform across an extent of the film, such that a weight density (e.g., mass or weight of phosphor particles per unit volume) or a number density (e.g., number of phosphor particles per unit volume) can exhibit a standard deviation of less than about 20 percent with respect to an average density, such as less than about 10 percent or less than about 5 percent.

Figure 4A:
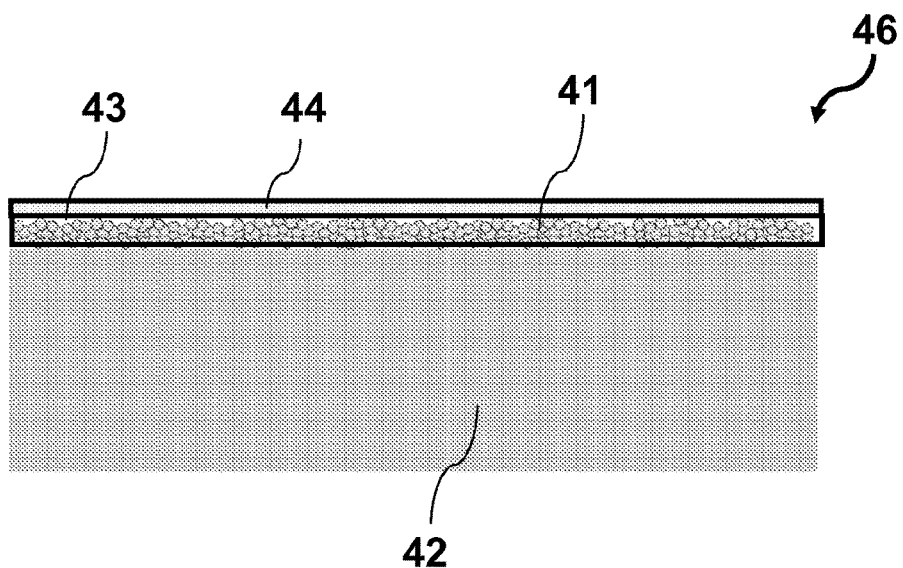
FIG. 4A depicts a single-color thin-film phosphor film stack formed using a conformal thin-film phosphor deposition process, according to an embodiment of the invention.

An embodiment of a thin-film phosphor layer prepared by the CVD method is depicted in FIG. 4A. In FIG. 4A, a single-color phosphor powder layer 41, such as a YAG: $Ce^{3+}$-based yellow phosphor, is initially deposited on a substrate surface 42. The substrate surface 42 can be a surface of a light extraction structure, which can be electrically nonconductive as in the case of a flexible plastic substrate. A parylene-based polymer layer 43 is deposited, and another parylene-based polymer layer 44 is next deposited. The parylene-based polymer layer 43 serves as a binder or a matrix that at least partially penetrates or surrounds the phosphor powder layer 41, such that phosphor particles of the phosphor powder layer 41 are dispersed within the parylene-based polymer layer 43. It will be appreciated that the parylene-based polymer layers 43 and 44 can be formed from the same material or different materials. In some instances, a refractive index of the parylene-based polymer layer 43 is greater than a refractive index of the parylene-based polymer layer 44. The resulting phosphor coated structure 46 can be laminated or otherwise disposed adjacent to a light emitting semiconductor device to form a phosphor-converted light emitting device.

Figure 4B:
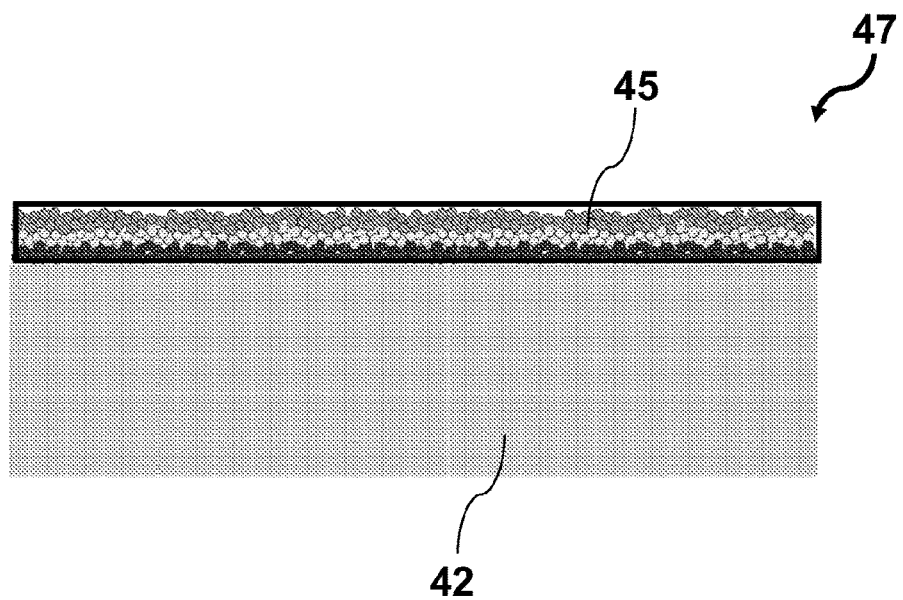
FIG. 4B depicts a multi-color thin-film phosphor composite film stack formed using a conformal thin-film phosphor deposition process, according to an embodiment of the invention.

In accordance with a layer-by-layer deposition of phosphor powders, the CVD method can be used to form a substantially uniformly distributed multi-color phosphor stack. In an embodiment depicted in FIG. 4B, a multi-color phosphor thin-film stack 45 is formed by sequential deposition of a blue phosphor powder, a parylene-based polymer as a binder material for the blue phosphor powder, a green phosphor powder, a parylene-based polymer as a binder material for the green phosphor powder, a red phosphor power, and a parylene-based polymer as a binder material for the red phosphor powder. The resulting phosphor coated structure 47 can be laminated or otherwise disposed adjacent to a light emitting semiconductor device to form a phosphor-converted white light emitting device, which can emit three down-converted secondary lights of respective colors by the phosphors. Thus, a Color Rendering Index ("CRI") of the phosphor-converted white light emitting device can be readily tuned, for example, when used in an indoor general illumination application with a warmer white light and improved color uniformity. Another application of the phosphor-converted white light emitting device incorporating the multi-color thin-film phosphor stack 45 is for backlighting of LCDs, where a larger display color gamut can be achieved with three peak wavelengths corresponding to red, green, and blue light colors emitted by red, green, and blue phosphors, respectively.

Light Extraction Structures

Internal reflection at a boundary between an encapsulant layer and air is a common source of light loss within an LED package. To reduce the loss within the encapsulant layer, an air/encapsulant interface is desirably convex and separated from a light source by a certain distance that depends on an effective diameter of the light source. In some instances, the encapsulant layer is formed with such a surface, and the surface is disposed at a certain distance from a light emitting device, such as an LED, and a reflector to ensure most, or all, of the light that leaves the light emitting device can escape from the encapsulant layer. Along this regard, a hemispherical lens, a microlens array, or a Fresnel lens can be incorporated as a light extraction structure or lens.

Incorporating phosphor powders dispersed within a light extraction lens can sometimes yield light scattering losses within an LED package. To increase light scattering efficiency, certain embodiments of the invention relate to forming a phosphor layer as a thin-film layer deposited on a coating surface of a light extraction lens.

A light extraction lens is typically formed of an optically transparent or translucent material, which is typically electrically nonconductive. As contrasted to EPD, a deposition method of a thin-film phosphor layer disclosed herein can be used to form conformal thin-film phosphor layers directly over an electrically nonconductive surface as well as an electrically conductive surface. The conformal thin-film phosphor layer also can be deposited over a flat surface as well as a non-flat surface, such as a convex or concave surface.

Phosphor-Coated Lens for Light Emitting Devices

Figure 5A:
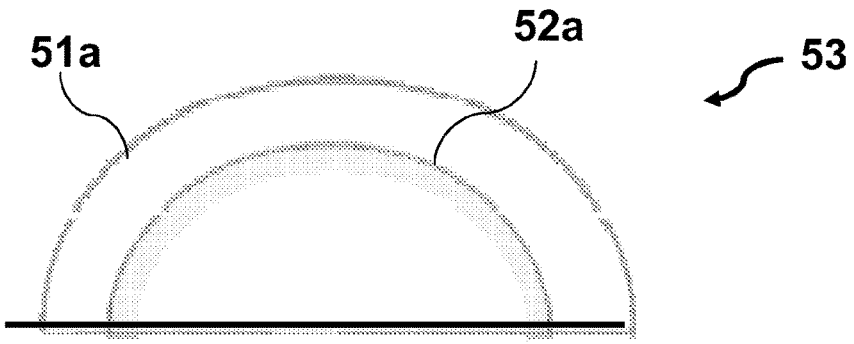
FIG. 5A depicts a thin-film conformal phosphor film stack deposited on an inner concave surface of a hollow hemispherical light extraction lens, according to an embodiment of the invention.
Figure 5B:
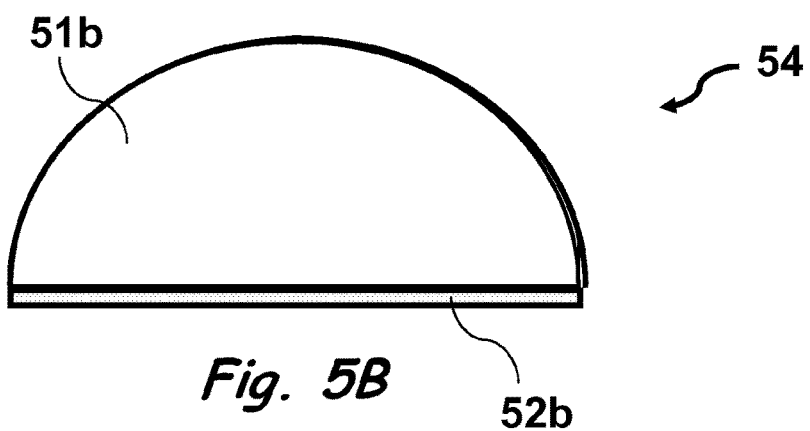
FIG. 5B depicts a thin-film conformal phosphor film stack deposited on a bottom surface of a solid hemispherical light extraction lens, according to an embodiment of the invention.
Figure 5C:
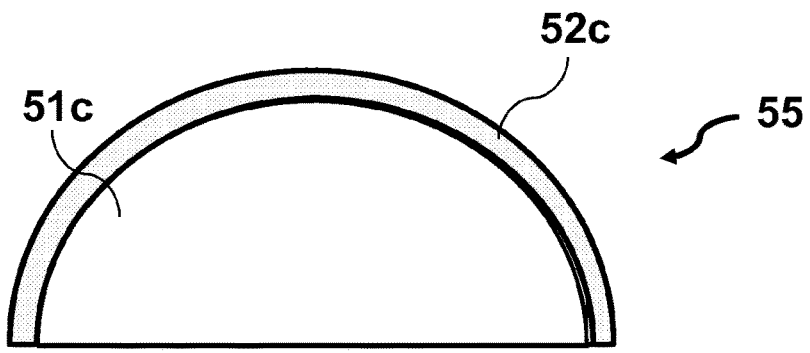
FIG. 5C depicts a thin-film conformal phosphor film stack deposited on an outer convex surface of a hemispherical light extraction lens, according to an embodiment of the invention.

A hemispherically shaped lens can be used as a light extraction lens structure for phosphor-converted white LEDs. According to one embodiment, the hemispherical lens is coated with a thin-film phosphor layer, resulting in a structure referred hereto as a phosphor-coated lens. For a phosphor-coated lens 53 depicted in FIG. 5A, a thin-film phosphor layer 52a is conformally deposited on an inner non-flat or non-planar surface of a hollow hemispherical lens 51a. As depicted in FIG. 5A, the inner non-flat surface is an inner concave surface having a generally curved profile, and this inner concave surface defines a cavity that faces a light emitting device during use. The lens 51a can be formed of an optically transparent material, such as epoxy, silicone, poly(methyl methacrylate), polycarbonate, glass, or quartz. In another embodiment, a thin-film phosphor layer 52b is conformally deposited on a bottom, substantially flat or planar surface of a solid hemispherical lens 51b, as depicted for a phosphor-coated lens 54 in FIG. 5B. This bottom, flat surface faces a light emitting device during use. In another embodiment, a thin-film phosphor layer 52c is conformally deposited on an outer non-flat surface of a hemispherical lens 51c, as depicted for a phosphor-coated lens 55 in FIG. 5C. As depicted in FIG. 5C, the outer non-flat surface is an outer convex surface having a generally curved profile, and this outer convex surface faces away from a light emitting device during use. In the illustrated embodiment, the hemispherical lens 51c is a solid hemispherical lens, although it is also contemplated that the hemispherical lens 51c can be a hollow hemispherical lens. It will be appreciated that the phosphor layers 52a, 52b, and 52c depicted in FIG. 5A through FIG. 5C can be single-color phosphor layers or multi-color phosphor layers. Also, it will be appreciated that the particular shapes and configurations depicted in FIG. 5A through FIG. 5C are provided by way of example, and various other embodiments are contemplated. For example, in other embodiments, the phosphor-coated lenses 53 and 54 also can include a thin-film phosphor layer that is conformally deposited on their respective outer convex surfaces, and the phosphor-coated lens 55 also can include a thin-film phosphor layer that is conformally deposited on its bottom, flat surface.

Figure 6:
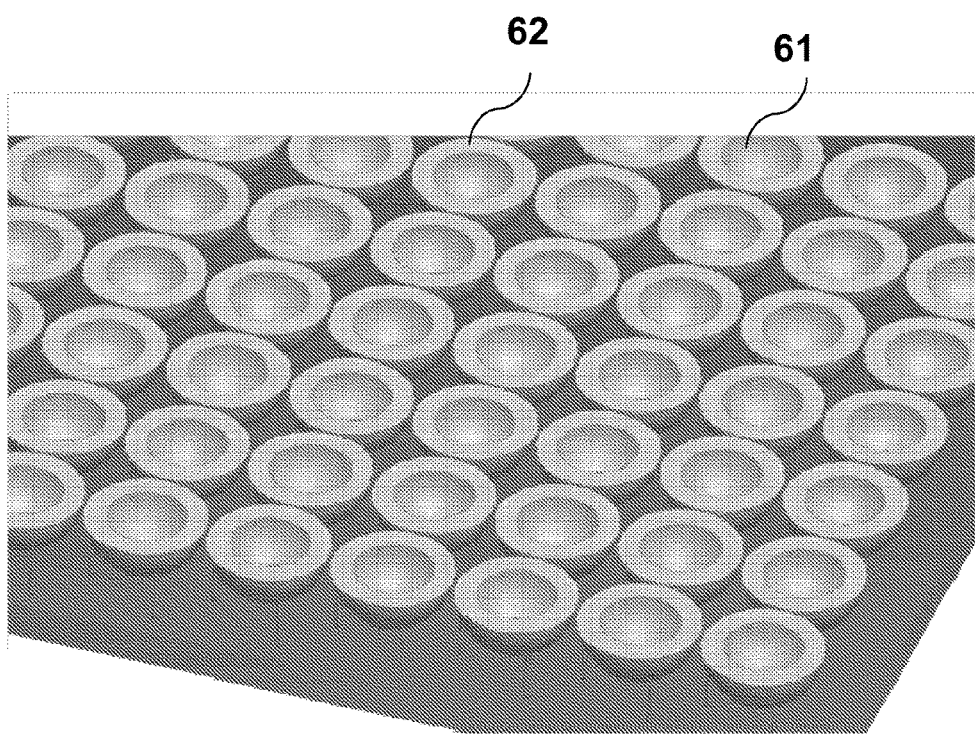
FIG. 6 depicts a batch coating process with thin-film phosphor layers conformally deposited on inner concave surfaces of multiple, hollow hemispherical lenses, according to an embodiment of the invention.

Another embodiment of a phosphor-coated LED lens involves embedding or incorporating a substantially uniform phosphor powder layer onto a surface of a LED lens according to the phosphor deposition method described herein. For example, a phosphor-embedded LED lens can be formed as follows:

Form an LED lens using injection molding of a liquid silicone gel
Form a substantially uniform phosphor powder layer onto a coating surface of the lens, which is still in a gel form
Let phosphor particles precipitate into the liquid silicone gel surface for a prescribed period of time
Cure the liquid silicone gel to solidify into a phosphor embedded LED lens FIG. 6 depicts a batch coating process with thin-film phosphor layers 61 conformally deposited on inner concave surfaces of multiple, hollow hemispherical lenses 62, according to an embodiment of the invention. Advantageously, the thin-film phosphor deposition process described herein can be implemented as a batch process, and thin-film phosphor layers can be substantially simultaneously deposited on surfaces of desirable substrates, such as surfaces of LED lenses, thereby enhancing manufacturing throughput and lowering costs per coating substrate.

Figure 7A:
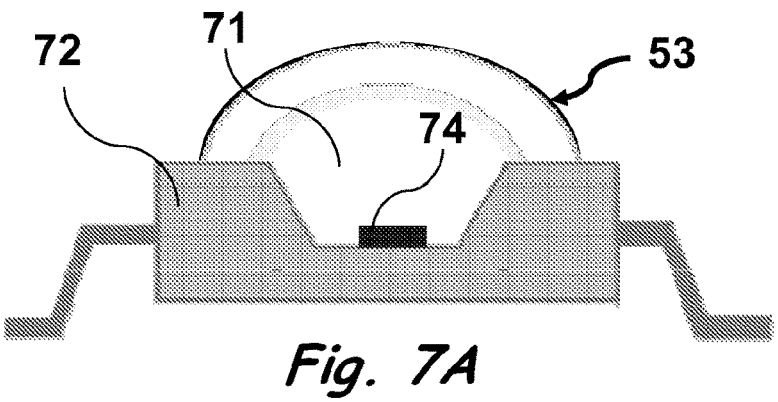
FIG. 7A depicts a phosphor-converted LED with a thin-film phosphor layer on an inner concave surface of a hemispherical lens structure produced using a conformal thin-film phosphor deposition process, according to an embodiment of the invention.
Figure 7B:
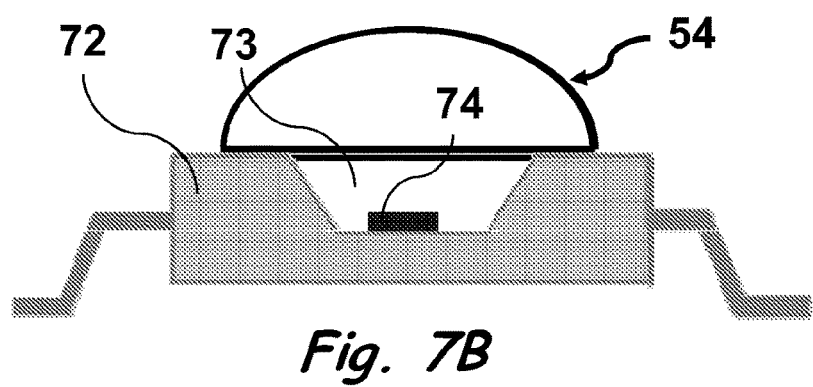
FIG. 7B depicts a phosphor-converted LED produced with a thin-film phosphor layer disposed on a bottom surface of a hemispherical lens structure, according to an embodiment of the invention.
Figure 7C:
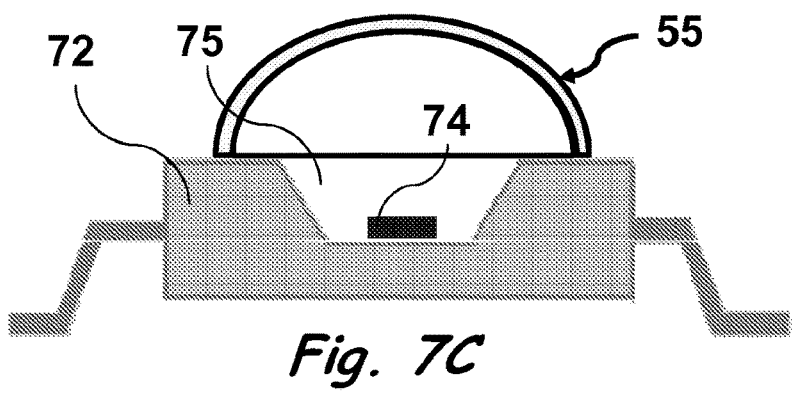
FIG. 7C depicts a phosphor-converted LED with a thin-film phosphor layer disposed on an outer convex hemispherical lens structure produced using a conformal thin-film phosphor deposition process, according to an embodiment of the invention.

FIG. 7A through FIG. 7C depict various embodiments of phosphor-converted LEDs that can be produced by connecting a phosphor-coated lens (e.g., the phosphor-coated lenses 53, 54 and 55 depicted in FIG. 5A through FIG. 5C) to a suitable lead frame, a substantially flat submount reflector, or a cup reflector 72. Connection can be accomplished using an appropriate encapsulant or adhesive, such as a silicone adhesive. Since a phosphor layer is placed at some distance from a light emitting device 74, as depicted in FIG. 7A through FIG. 7C, secondary light irradiated from the phosphor layer will primarily strike the submount reflector or the cup reflector 72, thus having a reduced probability of striking the highly absorbent light emitting device 74 directly. Also, since the phosphor layer is manufactured as a thin-film layer, a resulting scattering efficiency can be significantly improved, such as at least about 90%, at least about 92%, or at least about 95%, and up to about 99% or more. Furthermore, the phosphor-converted LEDs depicted in FIG. 7A through FIG. 7C can emit white light of greater uniformity. In particular, a CCT variation can be no greater than about 1,000 K over a 140° (±70° from a center light-emitting axis) range of light emission angles, such as no greater than about 800 K, no greater than about 500 K, or no greater than about 300 K, and down to about 200 K or less.

For the phosphor-converted LEDs depicted in FIG. 7A through FIG. 7C, it is desirable to form a cavity or an air gap 71, 73, or 75 between the thin-film phosphor layer and the light emitting device 74. When secondary light irradiated from the phosphor layer scatters backward towards the air gap 71, 73, or 75, the backward scattered secondary light has a higher probability of light reflection because of TIR at the air gap interface, due to the lower refractive index of the air gap (about 1) relative to the phosphor-coated lenses 53, 54 and 55. As a result, the air gap 71, 73, or 75 tends to deflect secondary light outwards so as to escape from the phosphor-converted LEDs, thus further increasing the package efficiency. It will be appreciated that another suitable low index material can be included in place of, or in conjunction with, air.

It will be appreciated that a number of variations can be implemented in a manufacturing process to produce phosphor-converted LEDs with a thin-film phosphor layer coated on a light extraction lens. For example, the light extraction lens initially can be connected to an LED or other light emitting device, and the thin-film phosphor layer next can be deposited on an outer surface of the light extraction lens to produce a phosphor-converted LED as depicted in FIG. 7C.

Still referring to FIG. 7A through FIG. 7C, an optical cavity (e.g., corresponding to the air gap 71, 73, or 75) advantageously is formed with its boundary defined by a reflector layer of the submount reflector or the cup reflector 72 and the thin-film phosphor layer disposed over the cup reflector 72. The size and shape of the optical cavity can be designed so that a primary light emitted from the light emitting device 74 and a secondary light irradiated from the thin-film phosphor layer are well mixed. Advantageously, the irradiation light pattern of the phosphor-converted LEDs depicted in FIG. 7A through FIG. 7C can be controlled by the size and shape of the optical cavity.

Figure 8A:
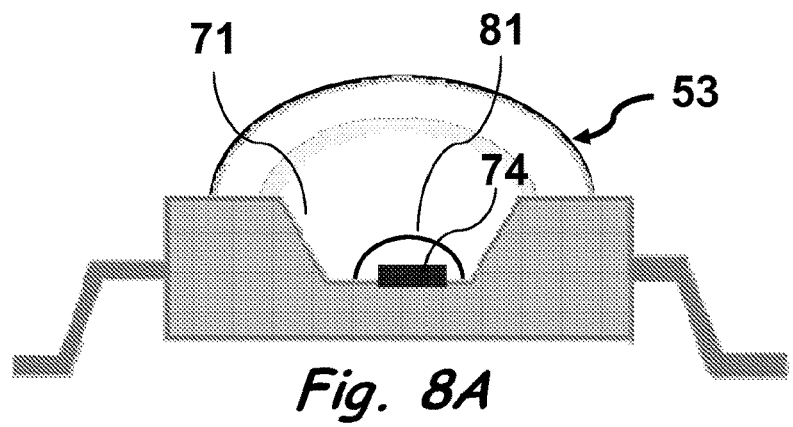
FIG. 8A depicts the phosphor-converted LED of FIG. 7A with a diffuser lens surrounding a light emitting device, according to an embodiment of the invention.
Figure 8B:
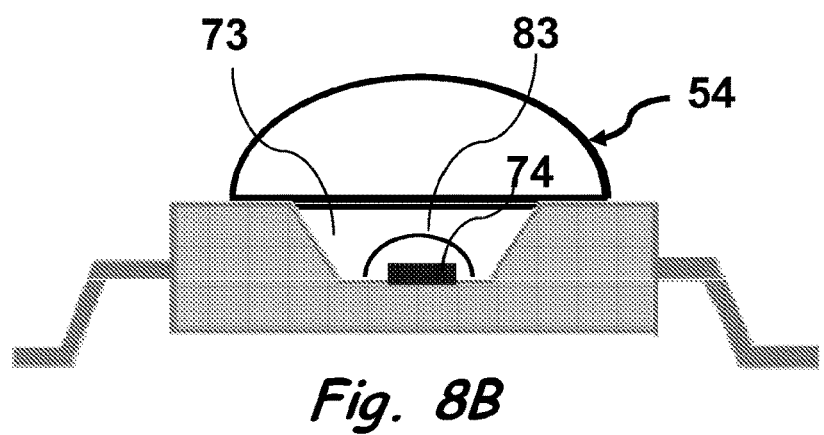
FIG. 8B depicts the phosphor-converted LED of FIG. 7B with a diffuser lens surrounding a light emitting device, according to an embodiment of the invention.
Figure 8C:
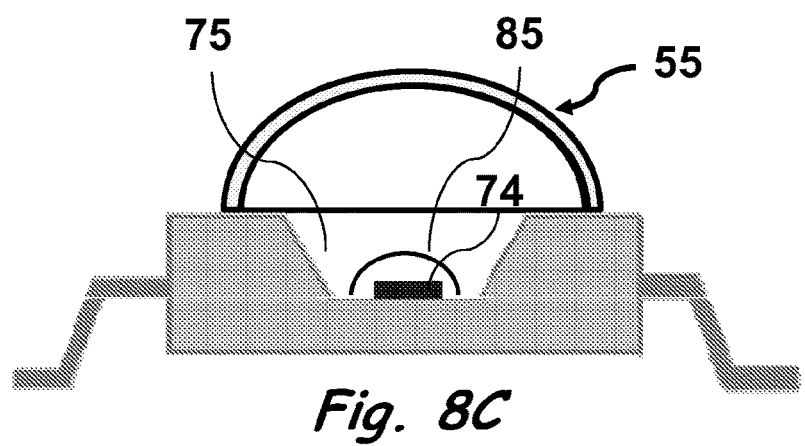
FIG. 8C depicts the phosphor-converted LED of FIG. 7C with a diffuser lens surrounding a light emitting device, according to an embodiment of the invention.

To further improve the efficiency of phosphor-converted LEDs, a smaller optically transparent or translucent hemispherical lens, such as a lens 81, 83, or 85 depicted in FIG. 8A through FIG. 8C, is disposed surrounding the light emitting device 74. The smaller hemispherical lens 81, 83, or 85 can serve as a diffuser lens to extract more primary light out of the light emitting device 74, such as from about 5% up to about 40% more primary light. Micrometer-scale features, such as a randomly or non-randomly (patterned) roughened surface, can be formed on convex surfaces of the smaller lenses 81, 83, and 85 to control an irradiation pattern of the primary light emitted from the light emitting device 74. It will be appreciated that the smaller lenses 81, 83, and 85 also can be implemented as substantially planar microlens arrays disposed over the light emitting device 74.

Phosphor-Coated Microlens for Light Emitting Devices

Figure 9A:
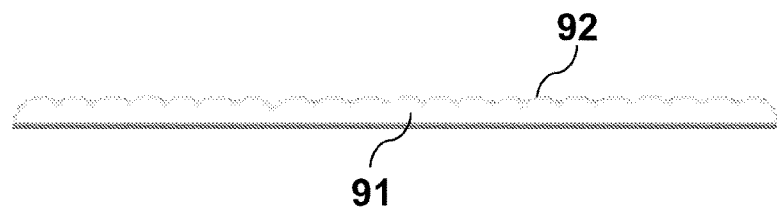
FIG. 9A depicts a microlens array coated with a thin-film phosphor layer, according to an embodiment of the invention.
Figure 9B:
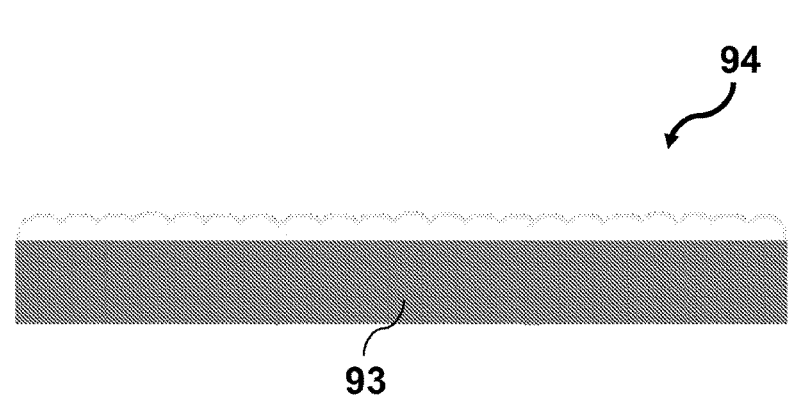
FIG. 9B depicts a phosphor-coated microlens array laminated over a semiconductor substrate, according to an embodiment of the invention.
Figure 9C:
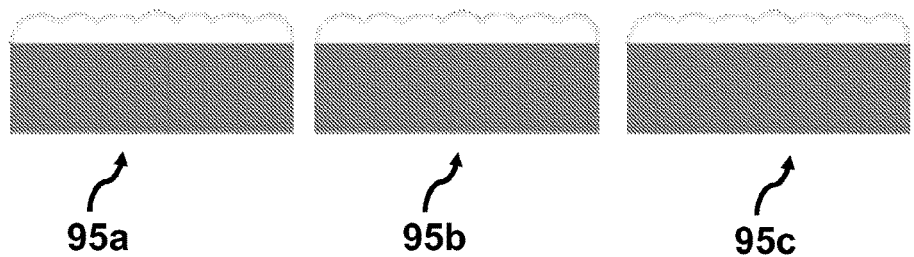
FIG. 9C depicts a semiconductor substrate laminated with a phosphor-coated microlens array being diced into separate phosphor-converted devices, according to an embodiment of the invention.

A microlens array also can be used as a light extraction structure placed over a light emitting device. According to one embodiment, the microlens array is coated with a thin-film phosphor layer, resulting in a structure referred hereto as a phosphor-coated microlens. In FIG. 9A, a thin-film phosphor layer 92 is conformally deposited on a surface of a microlens array 91 using a conformal thin-film phosphor deposition method. In FIG. 9B, the resulting phosphor-coated microlens array 94 is laminated over an LED semiconductor wafer 93. In FIG. 9C, the LED semiconductor wafer 93 laminated with the phosphor-coated microlens array 94 is then diced or singulated into separate phosphor-converted LEDs 95a, 95b, and 95c.

It will be appreciated that a number of variations can be implemented in a manufacturing process to produce phosphor-converted LEDs with a thin-film phosphor layer coated on a light extraction microlens array. For example, the microlens array initially can be manufactured on or laminated to an LED, and the thin-film phosphor layer next can be deposited on a surface of the microlens array to produce a phosphor-converted LED. Also, it will be appreciated that a thin-film phosphor layer similarly can be coated over a Fresnel lens to produce a phosphor-coated Fresnel lens, which can be connected to an LED to form a phosphor-converted LED.

Phosphor-Converted Light Emitting Devices

Some embodiments of the invention relate to disposing a substantially planar thin-film phosphor layer over an optical path of a light emitting device, such as an LED. Even though a light extraction lens can be desirable to increase the light extraction efficiency for a packaged LED, it can sometimes increase the spread of light emitted from the packaged LED. In some applications incorporating LEDs as a light source, such as LED backlighting for LCDs, a small etendue light beam emitted from an LED is involved. Along this regard, some embodiments of the invention relate to producing a substantially planar thin-film phosphor layer disposed over a substantially planar surface of an LED structure.

Figure 10A:
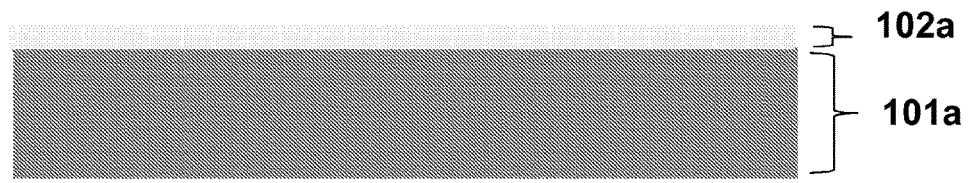
FIG. 10A depicts a thin-film phosphor layer disposed over a surface of a light emitting device, according to an embodiment of the invention.

One specific embodiment involves disposing a thin-film phosphor layer directly over a surface of a light emitting device. In FIG. 10A, a thin-film phosphor layer 102a formed as described herein is disposed over a light emitting side of a surface of a light emitting device 101a.

Figure 10B:
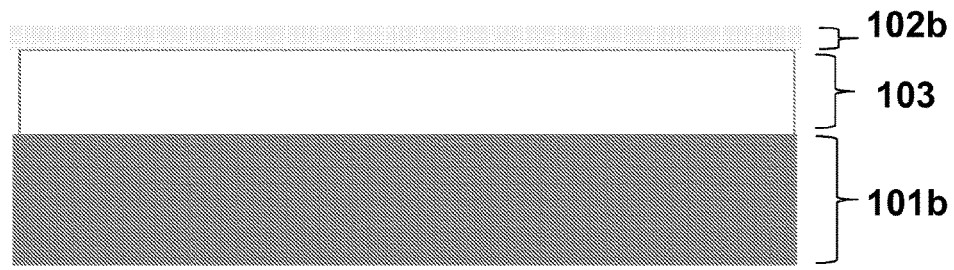
FIG. 10B depicts a thin-film phosphor layer disposed over a light emitting device with a planar spacer layer in between, according to an embodiment of the invention.

Another embodiment involves disposing a thin-film phosphor layer over a light emitting device with an optically transparent or translucent planar spacer layer in between. As depicted in FIG. 10B, a thin-film phosphor layer 102b formed as described herein is disposed over an optically transparent or translucent spacer layer 103, which, in turn, is disposed over a light emitting side of a surface of a light emitting device 101b.

Figure 10C:
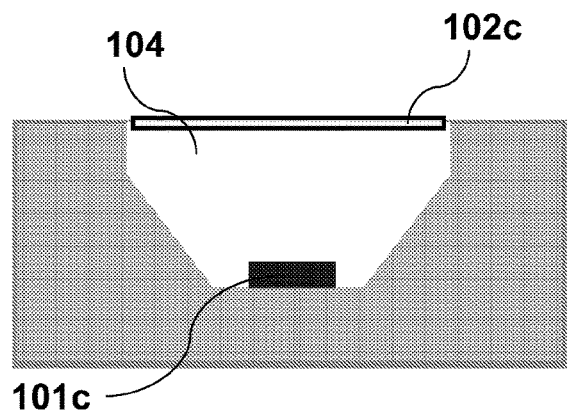
FIG. 10C depicts a thin-film phosphor layer disposed over an LED package, according to an embodiment of the invention.

In another embodiment as depicted in FIG. 10C, a thin-film phosphor layer 102c formed as described herein is disposed over a substantially planar surface of a packaged LED, where a light emitting device 101c is disposed in a suitable lead frame or cup reflector and is covered with an optically transparent or translucent encapsulant 104, such as epoxy or a silicone resin. It is also contemplated that an air-filled gap or cavity can be included in place of, or in conjunction with, the encapsulant 104 to mix a primary light emitted from the light emitting device 101c and a secondary light irradiated from the thin-film phosphor layer 102c. Due to the lower refractive index of the air gap (about 1), backward scattered secondary light has a higher probability of being reflecting outward from the packaged LED, thus further increasing the package efficiency. It will be appreciated that another suitable low index material can be included in place of, or in conjunction with, air.

Phosphor-Converted Photonic Crystal Light Emitting Devices

Because a light emitting device is typically formed of a high refractive index material, a light extraction structure is desirably incorporated to reduce TIR of light within the light emitting device. One way to improve LED efficiency is to assist in the extraction of light from the high-index light emitting device. For typical InGaN LEDs, a large fraction of energy can be emitted into waveguided modes internal to the LEDs, rather than radiation modes. Light generated inside the LEDs can undergo TIR, and there can be a high probability of light absorption before light can escape from the LEDs. A photonic crystal array structure can be effective as a light extraction mechanism for LEDs to produce a small etendue and highly collimated light beam. Also, a photonic crystal array structure of periodic variations of refractive index can improve light extraction by diffracting waveguided modes out of a light emitting device. Due to a planar two-dimensional periodic photonic lattice structure, photons can escape along a direction substantially perpendicular with respect to the light emitting device to generate small etendue light. Hence, a convex or hemispherical lens structure can be omitted for a photonic crystal light emitting device.

Figure 11:
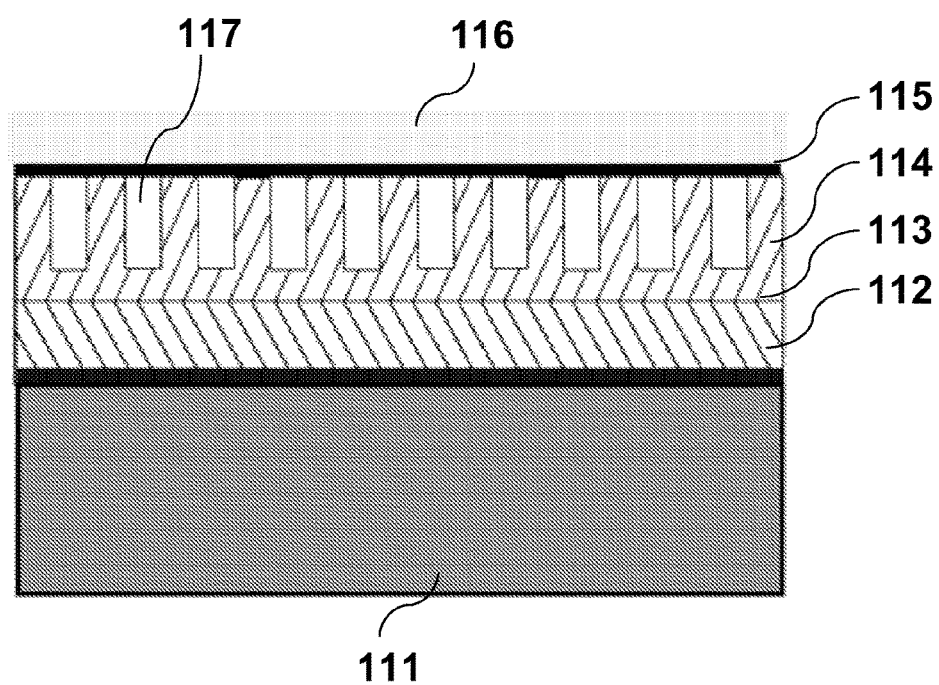
FIG. 11 depicts a phosphor-converted photonic crystal light emitting device, according to an embodiment of the invention.

In FIG. 11, a cross-sectional view of an embodiment of a phosphor-converted photonic crystal light emitting device is depicted, including a substrate 111, a p-type semiconductor layer 112, an active layer 113, an n-type semiconductor layer 114, an optically transparent or translucent electrode layer 115, and a thin-film phosphor layer 116. It will be appreciated that the thin-film phosphor layer 116 can be implemented as a single-color phosphor layer or a multi-color phosphor film stack. A photonic crystal structure is formed in or otherwise adjacent to the semiconductor layer 114, where a set of air holes, gaps, or cavities 117 are etched away from the semiconductor layer 114. The air holes 117 can be filled with a low refractive index dielectric material. For example, a conformal coating material can be utilized to fill the air holes 117, such as using the so-called gap filling process and with parylene-based dielectric materials, which can be prepared by vapor phase deposition and generally exhibit excellent conformal coating properties. It can be advantageous in the phosphor-converted photonic crystal light emitting device manufacturing process that the subsequently deposited layers 115 and 116 are formed over a solid surface, such as with the semiconductor layer 114 filled with a set of parylene-based polymers. Along this regard, another embodiment of the phosphor-converted photonic crystal light emitting device is to use a low refractive index dielectric, such as Parylene-F or Parylene-N, in place of the air hole structure 117.

One potential issue with the photonic crystal light emitting device depicted in FIG. 11 is that the hole structure in the semiconductor layer 114 can create current crowding. To facilitate current spreading in the semiconductor layer 114, the transparent electrode 115, such as an Indium Tin Oxide ("ITO") electrode, is formed over the photonic crystal structure. The substantially planar thin-film phosphor layer 116 is then disposed over the transparent electrode 115 to form a phosphor-converted photonic crystal light emitting device. It will be appreciated that the thin-film phosphor layer 116 can be disposed either by lamination of a prefabricated thin-film phosphor layer or by in-situ deposition of the thin-film phosphor layer 116 over the photonic crystal structure.

Wafer-Level Packaging Process for Light Emitting Devices

Another embodiment of the invention relates to a wafer-level, batch packaging process for light emitting devices incorporating a thin-film phosphor layer described herein. In contrast with conventional packaging processes, the wafer-level, batch process can yield packaged light emitting devices that are thinner and with less lens materials consumed, more consistent performance, and improved reliability. Even more advantageously, thinner and more uniform phosphor layers can be disposed as part of the wafer-level process, and the packaged light emitting devices can have improved efficiencies and greater reliability and can operate with less heat generated.

Figure 12A:
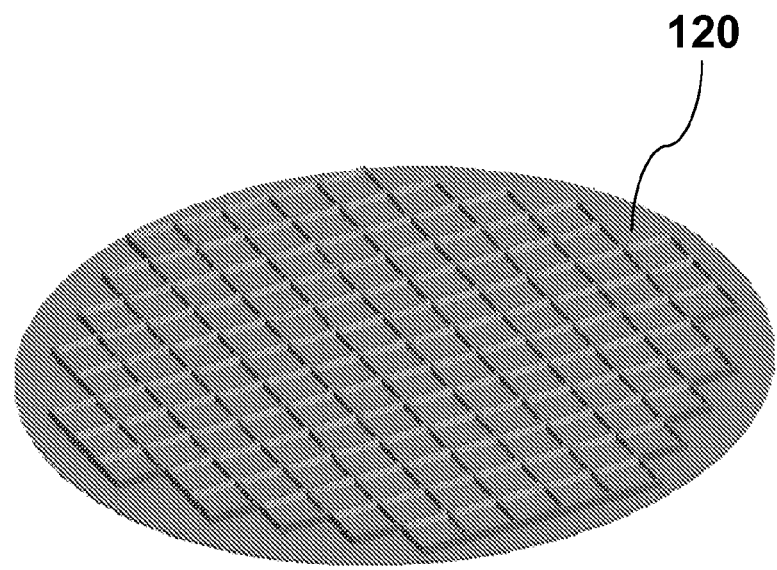

As depicted in FIG. 12A, a typical 200-mm aluminum, copper, or silicon wafer substrate 120 can hold as much as 10,000 LED packaging submount reflectors or reflector cups per substrate. Thus, a total cost of the wafer-level packaging process can be shared by the multiple devices manufactured per batch. As such, the packaging cost is less per device in terms of total packaging costs.

One embodiment of the wafer-level packaging process for light emitting devices includes the following operations:

(1) The packaging substrate 120 is formed with an array of cups or depressions and using an aluminum, copper, or silicon wafer substrate, as depicted in FIG. 12A. A reflector layer is deposited on the packaging substrate 120 to yield an array of reflector cups. It is desirable to have good reflectivity on a cup bottom or a cup wall so that backward scattered light can be reflected outward.

(2) Light emitting devices are connected to respective reflector cups of the packaging substrate 120. Electrodes of the light emitting devices can be, for example, wire bonded to the packaging substrate 120.

Figure 12B:
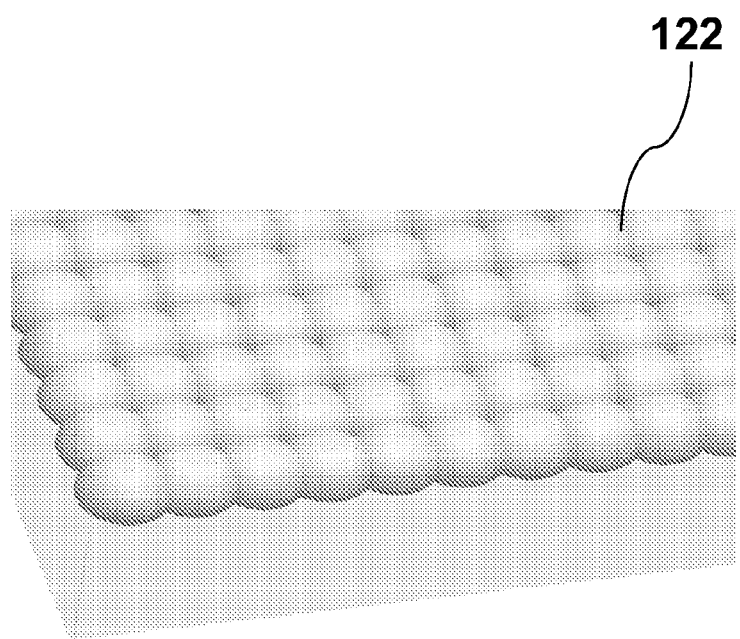

(3) Phosphor-coated microlens arrays 122 are formed, as depicted in FIG. 12B.

Figures 13A, 13B:
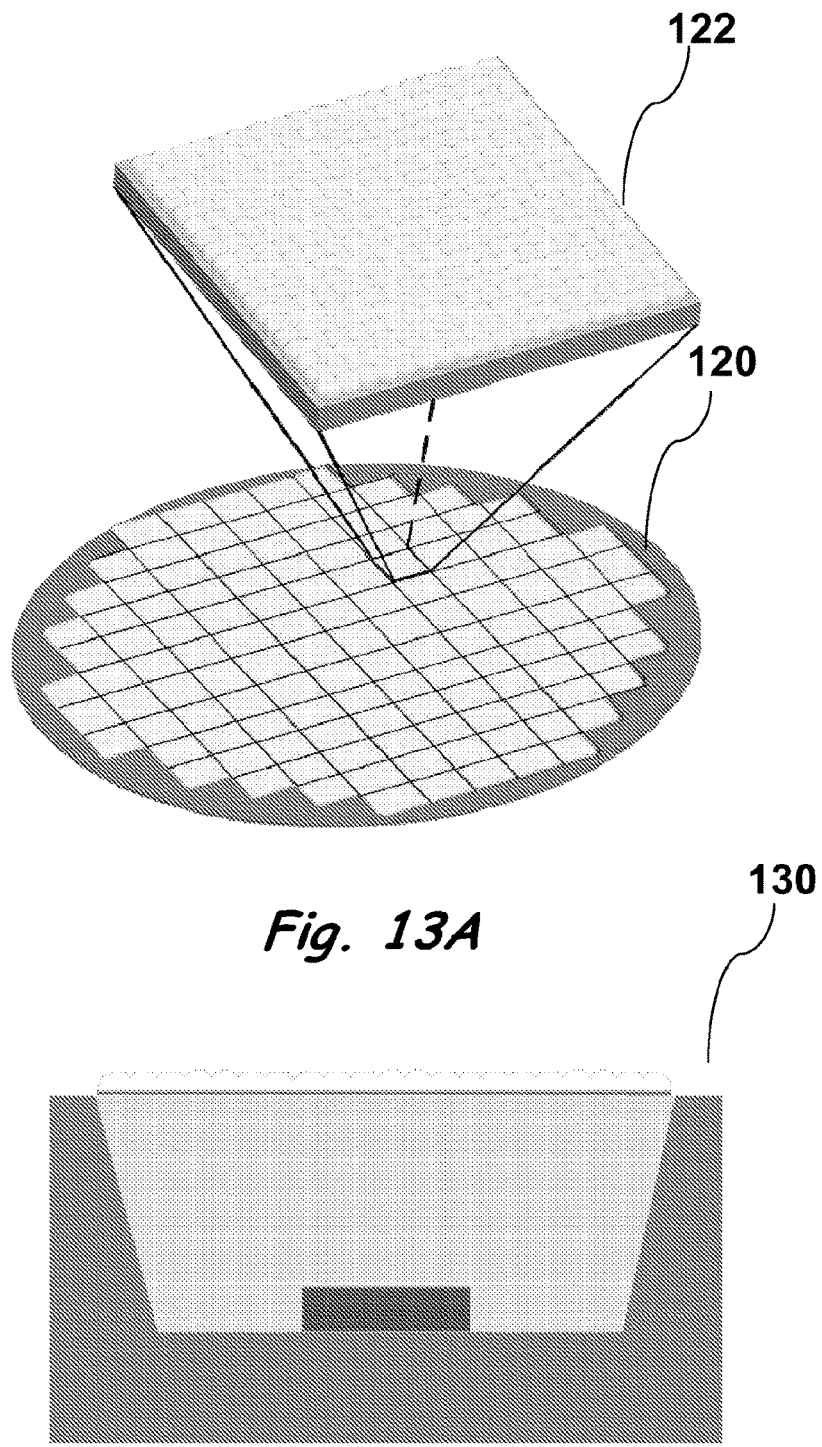

(4) The phosphor-coated microlens arrays 122 are connected to respective reflector cups of the packaging substrate 120, as depicted in FIG. 13A. It is also contemplated that a single phosphor-coated microlens array, which is sized to accommodate multiple reflector cups, can be connected to the packaging substrate 120.

(5) The packaging substrate 120 with the connected phosphor-coated microlens arrays 122 is diced or singulated to yield individual packaged light emitting devices, such as a packaged LED 130 depicted in FIG. 13B.

It will be appreciated that the wafer-level packaging process depicted in FIG. 12A through FIG. 13B is provided by way of example, and a variety of other embodiments are contemplated.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A method of forming a phosphor-converted light emitting device, comprising:
    providing a light extraction structure;
    forming a thin-film phosphor layer on the light extraction structure to form a phosphor-coated light extraction structure, wherein forming the thin-film phosphor layer includes:
        depositing a phosphor powder layer on the light extraction structure, the phosphor powder layer including first phosphor particles that are distributed on a surface of the light extraction structure; and
        subsequent to depositing the phosphor powder layer, depositing a first polymer film on the phosphor powder layer to serve as a binder for the first phosphor particles; and
    connecting the formed phosphor-coated light extraction structure to a light emitting device.

2. The method of claim 1, wherein the light extraction structure is one of a hemispherical lens, a Fresnel lens, and a microlens array.

3. The method of claim 1, wherein depositing the phosphor powder layer includes:
    inducing electrostatic charges in the first phosphor particles to adjust a distribution of the first phosphor particles along the surface of the light extraction structure.

4. The method of claim 1, wherein depositing the phosphor powder layer includes:
    depositing the first phosphor particles on the light extraction structure, while discharging the first phosphor particles using an ionizing gas.

5. The method of claim 1, wherein the first polymer film includes a polymer including a repeating unit of the formula: —CZZ'-Ar-CZ"Z'"—, wherein Ar is an un-substituted phenylene group, Z, Z', Z", and Z'" are selected from H, F, alkyl groups, and aryl groups, and at least one of Z, Z', Z", or Z'" is not hydrogen.

6. The method of claim 1, wherein the first polymer film includes a polymer including a repeating unit of the formula: —CZZ'-Ar-CZ"Z'"—, wherein Ar is a chlorine-substituted phenylene group of the formula: $C_6H_{4-x}Cl_x$, with x being an integer in the range of 1 to 4, and Z, Z', Z", and Z'" are independently selected from H, F, alkyl groups, and aryl groups.

7. The method of claim 1, wherein the first polymer film includes a polymer including a repeating unit of the formula: —CZZ'-Ar-CZ"Z'"—, wherein Ar is a fluorine-substituted phenylene group of the formula: $C_6H_{4-x'}F_{x'}$, with x' being an integer in the range of 1 to 4, and Z, Z', Z", and Z'" are independently selected from H, F, alkyl groups, and aryl groups.

8. The method of claim 1, wherein forming the thin-film phosphor layer further includes:
depositing a second polymer film on the first polymer film, wherein the first polymer film includes a first polymer, and the second polymer film includes a second polymer different from the first polymer.

9. The method of claim 8, wherein the second polymer is an organosilicon polymer.

10. The method of claim 1, wherein the first polymer film includes an organosilicon polymer.

11. The method of claim 1, wherein the phosphor powder layer includes second phosphor particles that are distributed on the surface of the light extraction structure, and the first phosphor particles and the second phosphor particles are configured to emit light of different colors.

12. A method of forming a phosphor-converted light emitting device, comprising:
providing a packaging substrate;
connecting an array of light emitting devices to the packaging substrate;
providing a microlens array;
connecting the provided microlens array to the packaging substrate and the array of light emitting devices;
depositing a phosphor powder layer on the microlens array, the phosphor powder layer including phosphor particles that are distributed on a surface of the microlens array;
subsequent to depositing the phosphor powder layer, depositing a first polymer film on the phosphor powder layer to serve as a binder for the phosphor particles; and
dicing the packaging substrate to form individual phosphor-converted light emitting devices.

13. The method of claim 12, wherein the first polymer film includes an organosilicon polymer.

14. The method of claim 13, wherein the phosphor powder layer and the first polymer film are placed in a vacuum chamber.

15. The method of claim 13, wherein depositing the first polymer film includes curing the organosilicon polymer.

16. The method of claim 12, further comprising:
depositing a second polymer film on the first polymer film.

17. The method of claim 16, wherein the first polymer film includes a polymer including a repeating unit of the formula: —CZZ'-Ar-CZ"Z'"—, wherein Ar is selected from (1) an un-substituted phenylene group, (2) a chlorine-substituted phenylene group of the formula: $C_6H_{4-x}Cl_x$, with x being an integer in the range of 1 to 4, and (3) a fluorine-substituted phenylene group of the formula: $C_6H_{4-x'}F_{x'}$, with x' being an integer in the range of 1 to 4, and Z, Z', Z", and Z'" are independently selected from H, F, alkyl groups, and aryl groups.

18. The method of claim 17, wherein the second polymer film includes an organosilicon polymer.

19. The method of claim 18, wherein the phosphor powder layer, the first polymer film, and the second polymer film are placed in a vacuum chamber.

20. The method of claim 18, wherein depositing the second polymer film includes curing the organosilicon polymer.

21. The method of claim 16, wherein a refractive index of the first polymer film is greater than a refractive index of the second polymer film.

22. A method of forming a phosphor-converted light emitting device, comprising:
providing a thin-film phosphor layer including phosphor particles and a polymer film serving as a binder for the phosphor particles; and
laminating the provided thin-film phosphor layer to a photonic crystal light emitting device to form a phosphor-converted, photonic crystal light emitting device, wherein providing the thin-film phosphor layer includes:
depositing the phosphor particles on a substrate; and
subsequent to depositing the phosphor particles, depositing the polymer film on the phosphor particles.

* * * * *